US010274563B2

(12) United States Patent
Choi

(10) Patent No.: US 10,274,563 B2
(45) Date of Patent: Apr. 30, 2019

(54) MAGNETIC RESONANCE IMAGING APPARATUS AND METHOD

(71) Applicant: SAMSUNG ELECTRONICS CO., LTD., Suwon-si (KR)

(72) Inventor: Sang-cheon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 231 days.

(21) Appl. No.: 15/166,810

(22) Filed: May 27, 2016

(65) Prior Publication Data

US 2016/0349340 A1    Dec. 1, 2016

(30) Foreign Application Priority Data

May 28, 2015  (KR) ........................ 10-2015-0074581

(51) Int. Cl.
    *G01R 33/48*     (2006.01)
    *G01R 33/483*    (2006.01)
    *G01R 33/561*    (2006.01)

(52) U.S. Cl.
    CPC ...... *G01R 33/4818* (2013.01); *G01R 33/4822* (2013.01); *G01R 33/4835* (2013.01); *G01R 33/5611* (2013.01)

(58) Field of Classification Search
    CPC ............ G01R 33/4818; G01R 33/4835; G01R 33/4822; G01R 33/5611
    USPC ................................................. 324/309, 322
    See application file for complete search history.

(56) References Cited

U.S. PATENT DOCUMENTS

| 6,242,916 | B1 | 6/2001 | King |
| 7,002,344 | B2 | 2/2006 | Griswold et al. |
| 7,808,240 | B2 | 10/2010 | Zhu |
| 9,170,315 | B2 * | 10/2015 | Choi ................ G01R 33/5611 |
| 2011/0241670 | A1 | 10/2011 | Lai et al. |
| 2015/0130461 | A1 | 5/2015 | Lee et al. |
| 2015/0212176 | A1 | 6/2015 | Lee et al. |

FOREIGN PATENT DOCUMENTS

| JP | 2009268904 A | 11/2009 |
| KR | 1020010051717 A | 6/2001 |
| KR | 10-2014-0097953 A | 8/2014 |
| KR | 10-2015-0047109 A | 5/2015 |
| KR | 10-2015-0054648 A | 5/2015 |
| KR | 1020150054647 A | 5/2015 |
| WO | 2015/060656 A1 | 4/2015 |

OTHER PUBLICATIONS

Communication dated Aug. 9, 2016, issued by the Korean Intellectual Property Office in counterpart Korean Application No. 10-2015-0074581.

(Continued)

Primary Examiner — Amy He
(74) Attorney, Agent, or Firm — Sughrue Mion, PLLC

(57) ABSTRACT

Provided are an apparatus and method for sampling magnetic resonance (MR) signals received from each of a plurality of channel coils included in a radio frequency (RF) multi-coil such that intervals between two acquired signals that are adjacent in a first axis direction of a 3D K-space are non-uniform; and restoring an MR image by using the received MR signals.

16 Claims, 19 Drawing Sheets

(56) References Cited

OTHER PUBLICATIONS

Communication (reexamination) dated Oct. 4, 2016, issued by the Korean Intellectual Property Office in counterpart Korean Application No. 10-2015-0074581.

Communication dated Sep. 1, 2016, issued by the International Searching Authority in counterpart International Application No. PCT/KR2016/005626 (PCT/ISA/210 & PCT/ISA/237).

Communication dated Apr. 6, 2017 issued by the Korean Intellectual Property Office in counterpart Korean Patent Application No. 10-2016-0145998.

Xiao, et al., "Comparison of Parallel MRI Reconstruction Methods for Accelerated 3D Fast Spin-Echo Imaging", 2008, Magnetic Resonance in Medicine, vol. 60, Issue No. 3, XP 055398396, 12 pages total.

Pang, et al., "Interpolated Compressed Sensing MR Image Reconstruction in Phase Encoding for the Brain", 2015, Proceedings of the International Society for Magnetic Resonance in Medicine, 23rd Annual Meeting and Exhibition, pp. 3499, XP 040669175.

Communication dated Aug. 24, 2017, issued by the European Patent Office in counterpart European Patent Application No. 16171749.1.

Kim, et al.; "Parallel Image Reconstruction Algorithm Using GRAPPA with Random Sampling", Korea Advanced Institute of Science and Technology (KAIST), Korea, 2011, 3 pages total.

Communication dated May 16, 2016, issued by the Korean Intellectual Property Office in counterpart Korean Application No. 10-2015-0074581.

Shin, et al.; "Calibrationless Parallel Imaging Reconstruction Based on Structured Low-Rank Matrix Completion", Magnetic Resonance in Medicine, Nov. 2013, 29 pages total.

Communication dated Dec. 1, 2016, issued by the Korean Intellectual Property Office in counterpart Korean application No. 10-2016-0145998.

\* cited by examiner

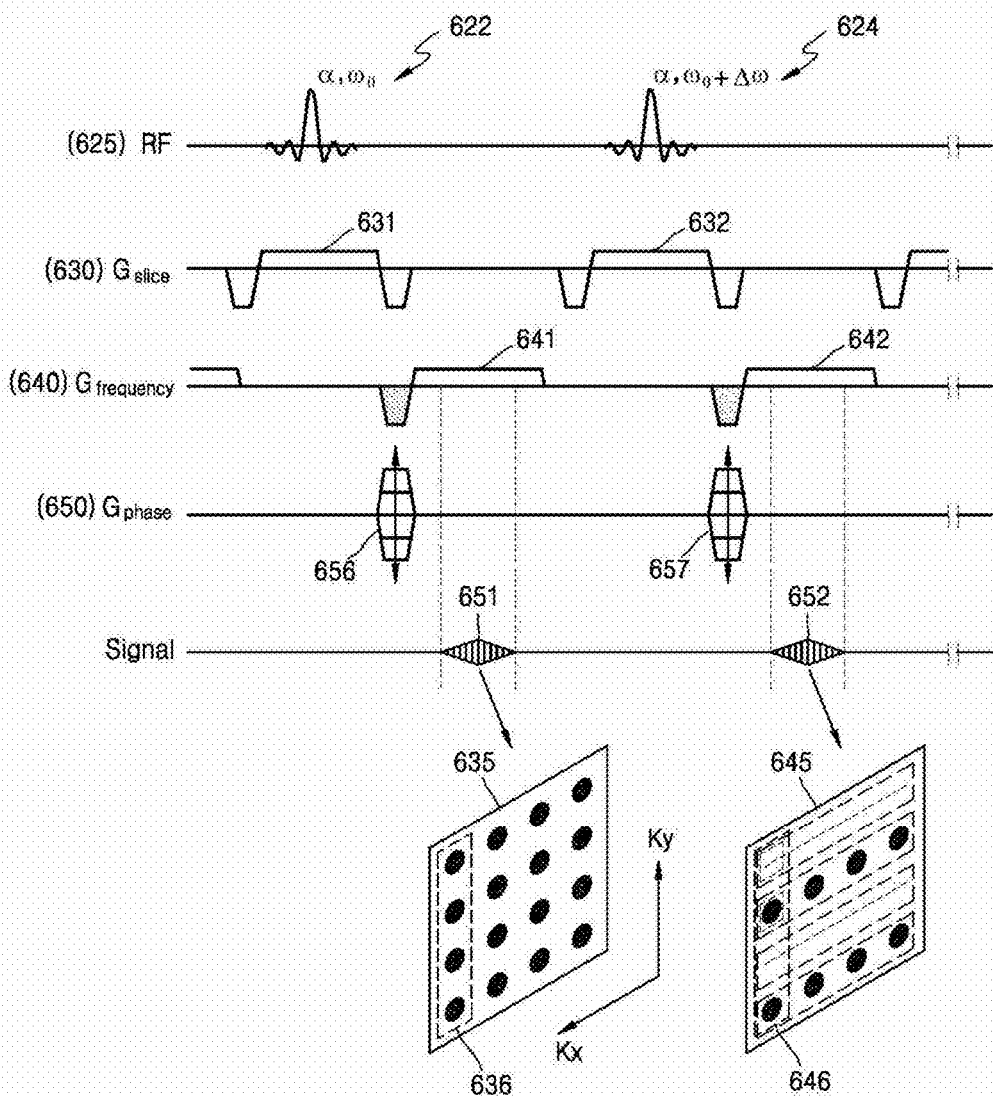

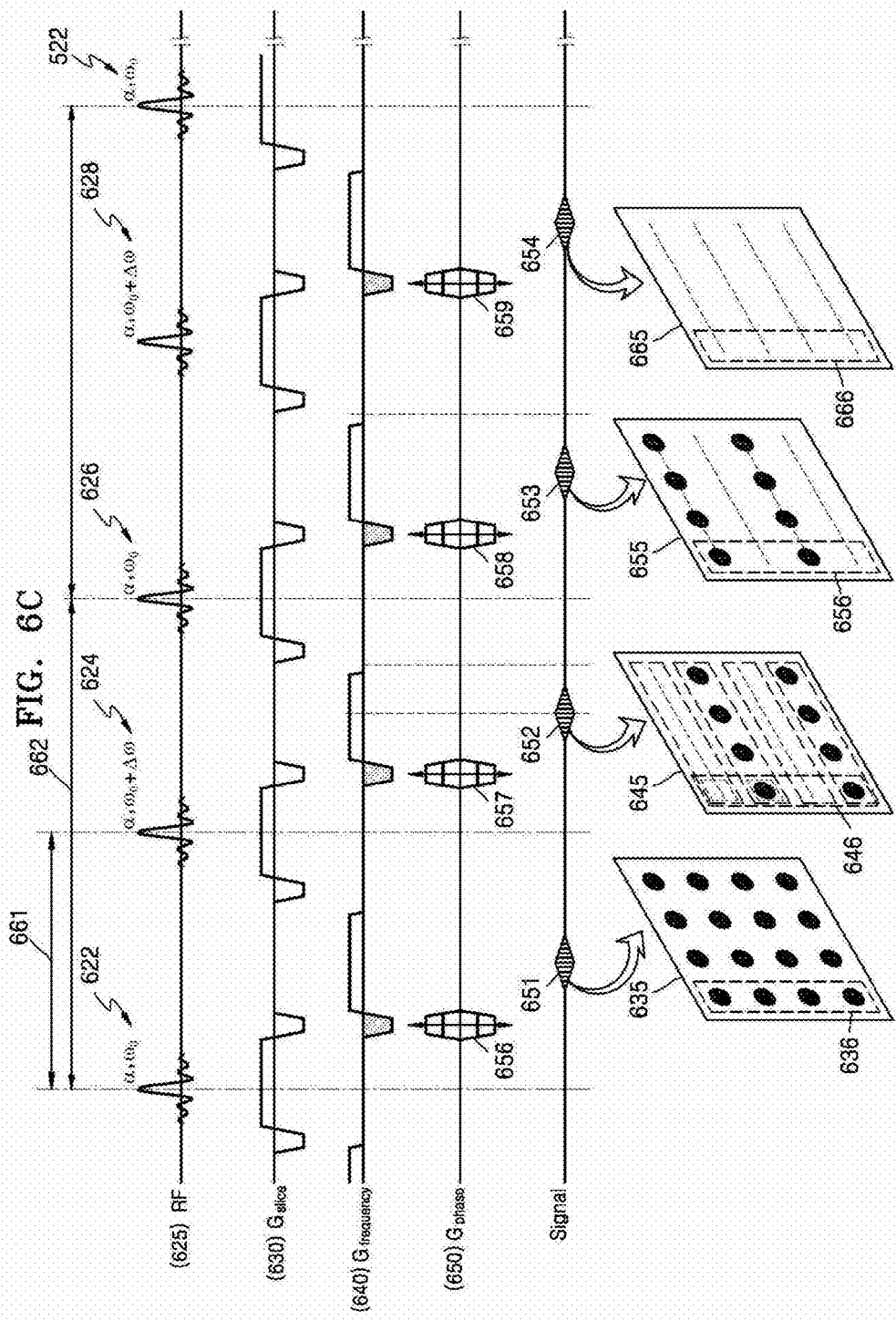

FIG. 9A
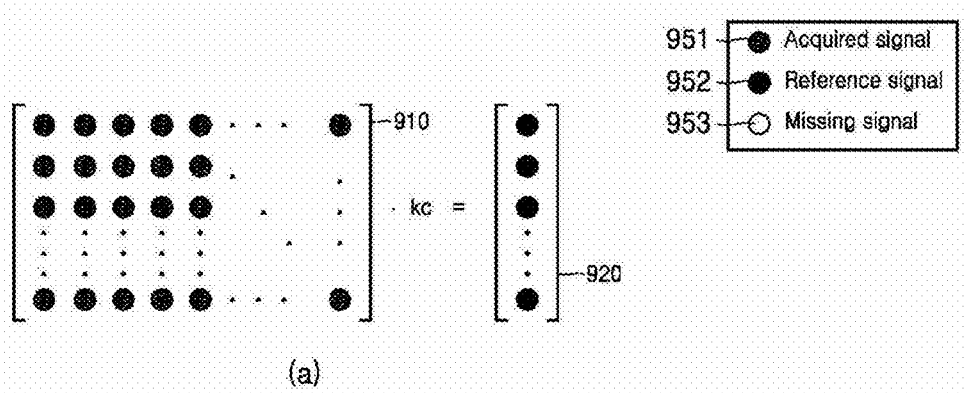
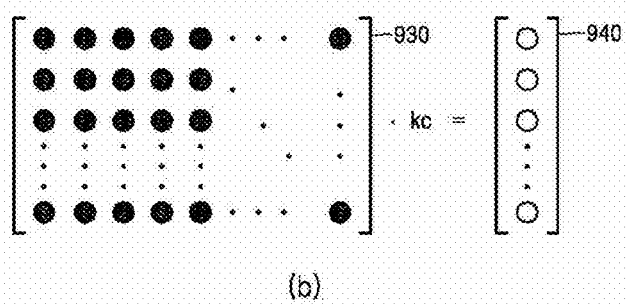

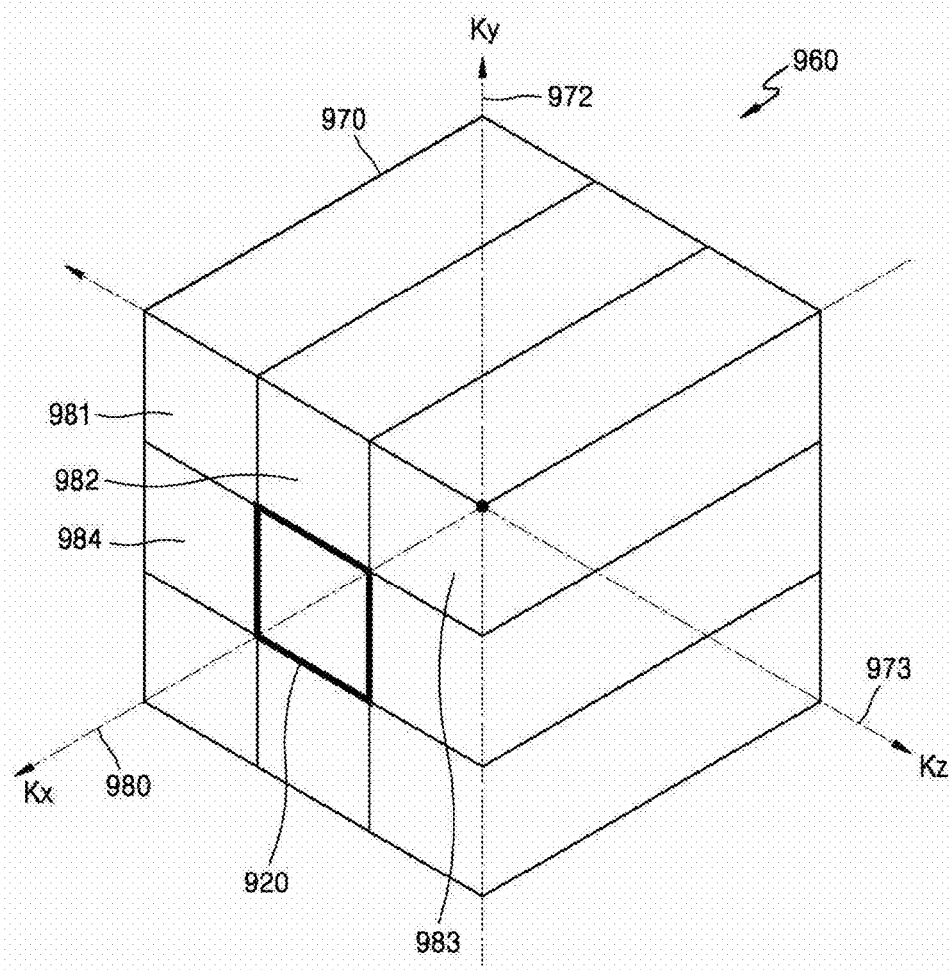

FIG. 10A

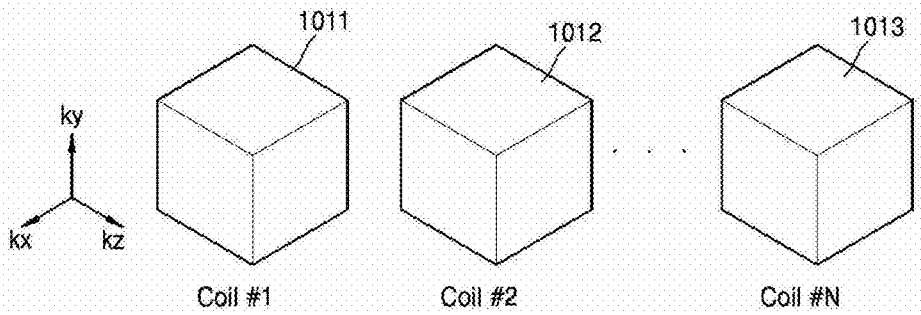

Coil #1    Coil #2    Coil #N

FIG. 10B $$S_{g,j}(k_y + B_y(n_y-1), k_x, k_z + B_z(n_z-1))$$
$$= \sum_{c=1}^{N_c} \sum_{b_y=1}^{N_b} \sum_{b_z=1}^{N_b} \sum_{h=-N_l}^{N_r} W_{g,j,r}(c, b_y, b_z, h) \times S_{g,c}(k_y + M(b_y, r), k_x + h\Delta k_x, k_z + M(b_z, r),)$$

FIG. 10C g : block group, j : coil number, $B_y$ : y-axis block size,
$B_z$ : z-axis block size, n : block number in a group,
$N_c$ : number of coils, $N_b$ : number of blocks near current block,
$N_r$, $N_l$ : the number of left and right neighbor frequency encoding data,
$W_{g,j,r}$ : net weights of the r-th net of coil j in g group,
r : acceleration factor,
$M(b_y, r)$, $M(b_z, r)$ : non-uniform sampling mask with r in b block

1210

1250

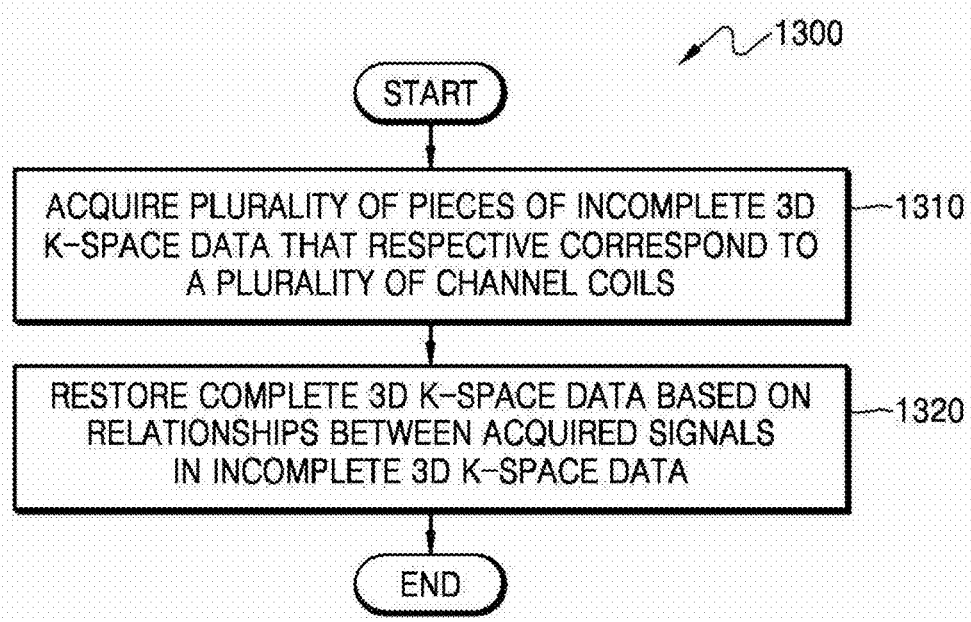

MAGNETIC RESONANCE IMAGING APPARATUS AND METHOD

CROSS-REFERENCE TO RELATED APPLICATION

This application claims priority from Korean Patent Application No. 10-2015-0074581, filed on May 28, 2015, in the Korean Intellectual Property Office, the disclosure of which is incorporated herein by reference in its entirety.

BACKGROUND

1. Field

One or more exemplary embodiments relate to a magnetic resonance imaging (MRI) apparatus and method, and more particularly, to an MRI apparatus and method for obtaining 3-dimensional (3D) MR images by undersampling in a 3D K-space.

2. Description of the Related Art

A magnetic resonance imaging (MRI) apparatus is an apparatus for capturing images of objects by using magnetic fields. The MRI apparatus is widely used for accurate diagnosis of medical issues relating to human patients, because the MRI apparatus may provide 3-dimensional (3D) images of bones, discs, joints, nerves, ligaments, and other parts of the human body from a desired angle.

The MRI apparatus acquires magnetic resonance (MR) signals, reconstructs the acquired MR signals, and outputs the reconstructed MR signals as images. For example, the MRI apparatus may acquire MR signals by using a radio frequency (RF) multi-coil that includes RF coils, permanent magnets, and gradient coils.

For example, a pulse sequence for generating RF signals may be applied to an RF multi-coil, and the generated RF signals may be applied to an object. MR signals are generated correspondingly to the applied RF signals, and sampled in order to restore a MR image.

According to current MRI technology, an MRI scan time may be approximately one hour. A general MRI apparatus includes a long and narrow tube (hereinafter, referred to as 'MRI tunnel'), and a patient who wants to be MRI scanned musts enter the MRI tunnel and stay still during the scanning procedure. Therefore, it may be difficult to perform MRI scanning on seriously ill patients or patients with claustrophobia, and even general patients may feel bored and inconvenienced due to the long scan time.

Thus, an image processing apparatus and method for reducing an MRI scan time are required.

In order to reduce the MRI scan time, instead of sampling MR signals at all points of a K-space image, i.e., full sampling, the MR signals may be acquired at some points of the K-space image and not acquired at other points of the K-space image, i.e., undersampling may be performed. In this case, signals that are not acquired from incomplete K-space data acquired by undersampling may be restored by calibration.

An example of an image processing method of restoring MR images may include Generalized Autocalibrating Partially Parallel Acquisitions (GRAPPA).

In particular, GRAPPA is an imaging technique that is based on a K-space, which includes calculating a spatial correlation coefficient by self-calibration and estimating unacquired signals by using the calculated spatial correlation coefficient. The spatial correlation coefficient is a spatial interaction value between a calibration signal and an estimated source signal nearby the calibration signal. The spatial correlation coefficient may also be referred to as a convolution kernel.

According to the GRAPPA technique, unacquired K-space lines may be restored according to channels by using estimated line data that includes undersampled data and additionally acquired autocalibration signal (ACS) line data.

When image signal data is damaged due to noise or a spatial interaction value is changed while restoring K-space data by calibration, aliasing artifacts and amplified noise may occur in a resulting MR image.

Therefore, it is necessary to provide an imaging method and apparatus for restoring an MR image with improved quality by reducing aliasing artifacts and preventing amplified noise.

SUMMARY

Provided are a magnetic resonance imaging (MRI) apparatus and method for improving the quality of restored 3-dimensional (3D) magnetic resonance (MR) images.

Provided are an MRI apparatus and method for reducing an MRI scan time.

Provided are an MRI apparatus and method for reducing an MR image restoration time.

Provided are an MRI apparatus and method for quickly and accurately restoring 3D MR images by only using acquired signals in 3D K-space data and without using calibration signals additionally acquired from some areas of a K-space, as in Generalized Autocalibrating Partially Parallel Acquisitions (GRAPPA), or coil sensitivity maps with additional coil information, as in Simultaneous Acquisition of Spatial Harmonics (SMASH).

Additional aspects will be set forth in part in the description which follows and, in part, will be apparent from the description, or may be learned by practice of the presented exemplary embodiments.

According to an aspect of an exemplary embodiment, an MRI apparatus includes a data acquirer configured to acquire a plurality of pieces of 3D K-space data which respectively correspond to a plurality of channel coils by sampling respective MR signals received from each of the plurality of channel coils in a radio frequency (RF) multi-coil such that intervals between pairs of the received signals that are mutually adjacent in a first axis direction of a 3D K-space are non-uniform; and an image processor configured use the acquired plurality of pieces of data to restore a complete set of 3D K-space data based on respective spatial relationships between the received signals.

The data acquirer may be further configured to acquire the plurality of pieces of 3D K-space data by sampling the received MR signals such that intervals between the pairs of received signals that are mutually adjacent in the first axis direction of the 3D K-space are non-uniform.

The data acquirer may be further configured to acquire the plurality of pieces of 3D K-space data by sampling the received MR signals on a plurality of planes that are perpendicular to the first axis direction and are adjacent to one another, and that include at least one first plane that is full-sampled, at least one second plane that is undersampled, and at least one third plane that is not sampled.

A non-uniform sampling pattern may be formed by sampling the MR signals based on lines such that the intervals between the pairs of received signals that are mutually adjacent in the first axis direction of the 3D K-space are non-uniform, and the non-uniform sampling pattern may be repeated a plurality of times in the 3D K-space in correspondence with the plurality of channel coils.

The data acquirer may be further configured to acquire the plurality of pieces of 3D K-space data by acquiring line data that has a direction that is parallel to a second axis direction which is perpendicular to the first axis direction and is completely sampled such that the intervals between the pairs of received signals that are mutually adjacent in the first axis direction of the 3D K-space are non-uniform. At least one line formed in a direction that is parallel to the first axis in the plurality of pieces of 3D K-space data may form a non-uniform sampling pattern in which intervals between pairs of mutually adjacent received signals are non-uniform.

A plurality of pieces of acquired line data that has a direction that is parallel to a second axis direction which is perpendicular to the first axis direction of the plurality of pieces of 3D K-space data may form a non-uniform sampling pattern in which intervals between pairs of adjacent acquired line data from among the plurality of pieces of acquired line data are non-uniform.

The image processor may be configured to determine, from the plurality of pieces of 3D K-space data, a first spatial correlation coefficient which is based on a spatial relationship between a reference signal and a plurality of other received signals, and to restore at least one unacquired signal that relates to the plurality of pieces of 3D K-space data based on the spatial relationship and the determined first spatial correlation coefficient.

When a first signal, which is an unacquired signal that relates to the plurality of pieces of 3D K-space data, and the plurality of other acquired signals satisfy the spatial relationship, the image processor may be further configured to acquire the first signal based on the determined first spatial correlation coefficient.

The image processor may be further configured to divide the plurality of pieces of 3D K-space data into a plurality of blocks, and to restore the complete set of 3D K-space data based on the blocks by using relationships between received signals included in the divided plurality of pieces of 3D K-space data.

A non-uniform sampling pattern, which is formed by a plurality of pieces of line data that has a direction that is parallel to a second axis direction which is perpendicular to the first axis direction of the plurality of pieces of 3D K-space data, may be identical in each of the plurality of blocks.

The data acquirer may be further configured to acquire at least one additional signal from any one of the plurality of blocks.

The data acquirer may be further configured to acquire at least one less signal from any one of the plurality of blocks.

A non-uniform sampling pattern formed by a line that is parallel to the first axis direction of the plurality of pieces of 3D K-space data may vary with respect to at least two of the plurality of blocks.

The MRI apparatus may further include a controller configured to set a first non-uniform sampling pattern that corresponds to a block located in a central area of the 3D K-space to be denser than a second non-uniform sampling pattern that corresponds to a block located in a peripheral area of the 3D K-space.

The image processor may be further configured to restore the complete 3D K-space data according to each of the plurality of channel coils and thus restore a plurality of pieces of complete 3D K-space data that corresponds to the plurality of channel coils.

The image processor may be further configured to restore a 3D MR image by spatially transforming the plurality of pieces of complete 3D K-space data and using a sum of the plurality of pieces of spatially transformed complete 3D K-space data.

According to an aspect of another exemplary embodiment, an MRI apparatus includes an RF multi-coil that includes a plurality of channel coils configured to apply a radio frequency signal to an object and to receive respective MR signals that are emitted by a nuclear spin of the object in response to the applied radio frequency signal; a data acquirer configured to acquire a plurality of pieces of 3D K-space data which respectively correspond to the plurality of channel coils by sampling the received MR signals such that intervals between pairs of the received signals that are mutually adjacent in a first axis direction of a 3D K-space are non-uniform; and an image processor configured to use the acquired plurality of pieces of data to restore a complete set of 3D K-space data based on respective spatial relationships between the received signals.

According to an aspect of another exemplary embodiment, an MRI method includes acquiring a plurality of pieces of 3D K-space data which respectively correspond to a plurality of channel coils by sampling respective MR signals received from each of the plurality of channel coils in an RF multi-coil such that intervals between pairs of the received signals that are mutually adjacent in a first axis direction of a 3D K-space are non-uniform; and using the acquired plurality of pieces of data to restore a complete set of 3D K-space data based on respective spatial relationships between the received signals.

The acquiring may include acquiring the plurality of pieces of 3D K-space data by sampling the received MR signals such that the intervals between the pairs of received signals that are adjacent in the first axis direction of the 3D K-space are non-uniform.

The acquiring may include acquiring the plurality of pieces of 3D K-space data by sampling the received MR signals on a plurality of planes that are perpendicular to the first axis direction and are adjacent to one another, and that include at least one first plane that is full-sampled, at least one second plane that is undersampled, and at least one third plane that is not sampled.

A non-uniform sampling pattern may be formed by sampling the MR signals based on lines such that the intervals between the pairs of received signals that are mutually adjacent in the first axis direction of the 3D K-space are non-uniform, and the non-uniform sampling pattern may be repeated a plurality of times in the 3D K-space in correspondence with the plurality of channel coils.

The acquiring may include acquiring the plurality of pieces of 3D K-space data by acquiring line data that has a direction that is parallel to a second axis direction which is perpendicular to the first axis direction and is completely sampled such that the intervals between the pairs of received signals that are mutually adjacent in the first axis direction of the 3D K-space are non-uniform. At least one line formed in a direction that is parallel to the first axis direction in the plurality of pieces of 3D K-space data may form a non-uniform sampling pattern in which the intervals between pairs of mutually adjacent received signals are non-uniform.

The restoring may include determining, from the plurality of pieces of 3D K-space data, a first spatial correlation coefficient which is based on a spatial relationship between a reference signal and a plurality of other received signals; and restoring at least one unacquired signal that relates to the plurality of pieces of 3D K-space data based on the spatial relationship and the determined first spatial correlation coefficient.

The restoring of the at least one unacquired signal may include acquiring, when a first signal, which is an unacquired signal that relates to the plurality of pieces of 3D K-space data, and a plurality of other acquired signals satisfy the spatial relationship, the first signal based on the determined first spatial correlation coefficient.

The restoring may include dividing the plurality of pieces of 3D K-space data into a plurality of blocks; and restoring the complete set of 3D K-space data based on the plurality of blocks by using relationships between received signals included in the divided plurality of pieces of 3D K-space data.

A non-uniform sampling pattern, which is formed by a line that has a direction that is parallel to the first axis direction of the plurality of pieces of 3D K-space data, may be identical in each of the plurality of blocks.

A non-uniform sampling pattern, which is formed by a plurality of pieces of line data that has a direction that is parallel to a second axis direction which is perpendicular to the first axis direction of the plurality of pieces of 3D K-space data, may vary with respect to at least two of the plurality of blocks.

The acquiring may further include setting a first non-uniform sampling pattern that corresponds to a block located in a central area of the 3D K-space to be denser than a second non-uniform sampling pattern that corresponds to a block located in a peripheral area of the 3D K-space.

The restoring may include restoring the complete set of 3D K-space data according to each of the plurality of channel coils. The MRI method may further include restoring a plurality of pieces of complete 3D K-space data that corresponds to the plurality of channel coils.

The MRI method may further include spatially transforming the plurality of pieces of complete 3D K-space data; and restoring a 3D MR image by using a sum of the plurality of pieces of spatially transformed complete 3D K-space data.

BRIEF DESCRIPTION OF THE DRAWINGS

These and/or other aspects will become apparent and more readily appreciated from the following description of exemplary embodiments, taken in conjunction with the accompanying drawings in which:

FIG. 6B is a diagram for describing operations of the MRI apparatus of FIG. 6A;

FIG. 6C is another diagram for describing operations of the MRI apparatus of FIG. 6A;

FIG. 9A is a diagram for describing an acquisition of a spatial correlation coefficient;

FIG. 9B is a diagram for describing a setting of a sampling pattern according to blocks;

FIGS. 10A, 10B and 10C are diagrams for describing a weighting matrix;

FIG. 13 is a flowchart of an MRI method, according to an exemplary embodiment.

DETAILED DESCRIPTION

Figure 1:
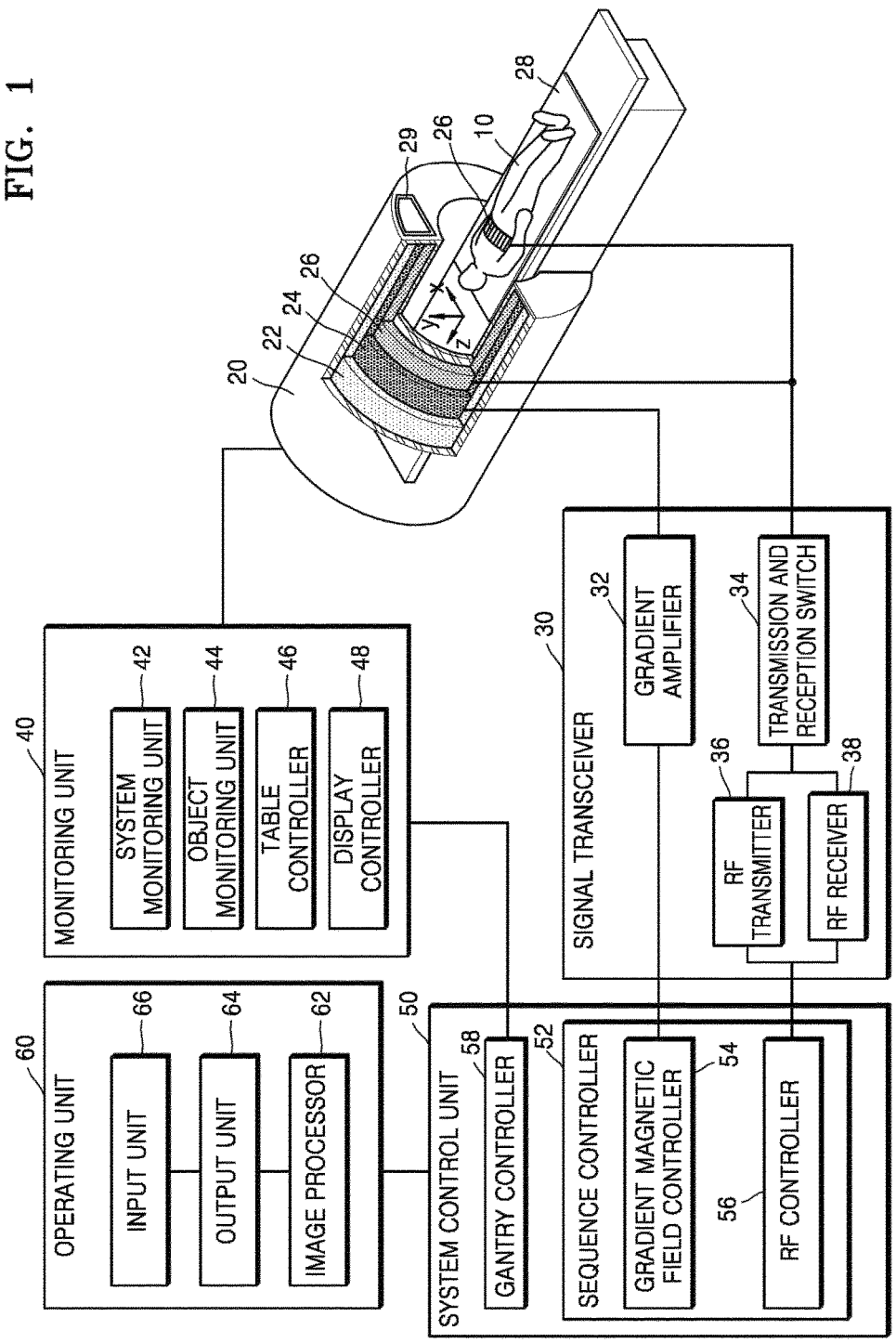
FIG. 1 is a block diagram of a general magnetic resonance imaging (MRI) system.

Advantages and features of one or more exemplary embodiments and methods of accomplishing the same may be understood more readily by reference to the following detailed description of the exemplary embodiments and the accompanying drawings. In this regard, the present exemplary embodiments may have different forms and should not be construed as being limited to the descriptions set forth herein. Rather, these exemplary embodiments are provided so that this disclosure will be thorough and complete and will fully convey the concept of the present exemplary embodiments to one of ordinary skill in the art, and the present inventive concept will only be defined by the appended claims.

Hereinafter, the terms used in the specification will be briefly described, and then the exemplary embodiments will be described in detail.

The terms used in this specification are those general terms currently widely used in the art in consideration of functions regarding the exemplary embodiments, but the terms may vary according to the intention of those of ordinary skill in the art, precedents, or new technology in the art. Also, some terms may be arbitrarily selected by the applicant, and in this case, the meaning of the selected terms will be described in detail in the detailed description of the present specification. Thus, the terms used herein have to be defined based on the meaning of the terms together with the description throughout the specification.

When a part "includes" or "comprises" an element, unless there is a particular description contrary thereto, the part can further include other elements, not excluding the other elements. Further, the term "unit" in the context of the exemplary embodiments means a software component or hardware component such as a field-programmable gate array (FPGA) or an application-specific integrated circuit (ASIC), and performs a specific function. However, the term "unit" is not limited to software or hardware. The "unit" may be formed so as to be in an addressable storage medium, or may be formed so as to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units".

Reference will now be made in detail to exemplary embodiments, examples of which are illustrated in the accompanying drawings. In the following description, well-known functions or constructions are not described in detail so as not to obscure the exemplary embodiments with unnecessary detail.

In the present specification, an "image" may refer to multi-dimensional data composed of discrete image elements (e.g., pixels in a two-dimensional (2D) image and voxels in a three-dimensional (3D) image). For example, the image may be a medical image of an object captured by any of an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. The object may be a phantom. The phantom means a material having a density, an effective atomic number, and a volume that are approximately the same as those of an organism. For example, the phantom may be a spherical phantom having properties similar to the human body.

Furthermore, in the present specification, a "user" may be, but is not limited to, a medical expert, such as a medical doctor, a nurse, a medical laboratory technologist, or a technician who repairs a medical apparatus.

Furthermore, in the present specification, an "MR image" refers to an image of an object obtained by using the nuclear magnetic resonance principle.

Furthermore, in the present specification, a "pulse sequence" refers to continuity of signals repeatedly applied by an MRI apparatus. The pulse sequence may include a time parameter of a radio frequency (RF) pulse, for example, repetition time (TR) or echo time (TE).

Furthermore, in the present specification, a "pulse sequence schematic diagram" shows an order of events that occur in an MRI apparatus. For example, the pulse sequence schematic diagram may be a diagram showing an RF pulse, a gradient, an MR signal, or the like as a function of time.

An MRI system is an apparatus for acquiring a sectional image of a part of an object by expressing, in a contrast comparison, a strength of a MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus the MRI system may receive the MR signal and acquire an MR image. The MR signal denotes an RF signal emitted from the object. An intensity of the MR signal may be determined based on any of a density of a predetermined atom (for example, hydrogen) of the object, a relaxation time T1, a relaxation time T2, and/or a flow of blood or the like.

MRI systems include characteristics which are different from those of other imaging apparatuses. Unlike imaging apparatuses such as CT apparatuses that acquire images according to a direction of detection hardware, MRI systems may acquire 2D images or 3D volume images that are oriented toward an optional point. MRI systems do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are required to precisely capturing abnormal tissues.

FIG. 1 is a block diagram of a general MRI system. Referring to FIG. 1, the general MRI system may include a gantry 20, a signal transceiver 30, a monitoring unit (also referred to herein as a "monitor") 40, a system control unit (also referred to herein as a "system controller") 50, and an operating unit (also referred to herein as an "operator") 60.

The gantry 20 prevents external emission of electromagnetic waves generated by a main magnet 22, a gradient coil 24, and an RF coil 26. A magnetostatic field and a gradient are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradients in X-axis, Y-axis, and Z-axis directions which cross each other at right angles. The gradient coil 24 may provide location information of each region of the object 10 by variably inducing resonance frequencies according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal that has the same frequency as that of the precessional motion, stop transmitting the RF signal, and then receive an MR signal emitted from the atomic nuclei included in the patient.

For example, in order to induce an atomic nucleus to transit from a low energy state to a high energy state, the RF coil 26 may generate and apply an electromagnetic wave signal that is an RF signal which corresponds to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves that have a Larmor frequency. In this aspect, when the applying of the electromagnetic wave signal to the atomic nucleus is stopped, an energy level of the atomic nucleus is changed from a high energy level to a low energy level, and thus the atomic nucleus may emit electromagnetic waves that have a Larmor frequency. The RF coil 26 may receive electromagnetic wave signals from atomic nuclei included in the object 10.

The RF coil 26 may be realized as one RF transmitting and receiving coil that has both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil that has a function of generating electromagnetic waves each having an RF that corresponds to a type of an atomic nucleus, and a reception RF coil that has a function of receiving electromagnetic waves emitted from an atomic nucleus.

The RF coil 26 may be fixed to the gantry 20 or may be detachable. When the RF coil 26 is detachable, the RF coil 26 may include an RF coil for a part of the object, such as any of a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may include any of a transmission exclusive coil, a reception exclusive coil, or a transmission and reception coil based on methods of transmitting and receiving an RF signal.

The RF coil 26 may include an RF coil that has any of various numbers of channels, such as 16 channels, 32 channels, 72 channels, and 144 channels.

The gantry 20 may further include an external display 29 disposed outside the gantry 20 and an internal display (not shown) disposed inside the gantry 20. The gantry 20 may provide predetermined information to the user or the object 10 via the external display 29 and the internal display respectively disposed outside and inside the gantry 20.

The signal transceiver 30 may control the gradient formed inside the gantry 20, i.e., in the bore, based on a predetermined MR sequence, and may control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient to the gradient coil 24 under the control of a gradient magnetic field controller 54. By controlling the pulse signal supplied from the gradient amplifier 32 to the gradient coil 24, gradients in X-axis, Y-axis, and Z-axis directions may be synthesized.

The RF transmitter 36 and the RF receiver 38 may drive the RF coil 26. The RF transmitter 36 may supply an RF pulse in a Larmor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 via the RF coil 26 during a transmission mode, and receive the MR signal from the object 10 via the RF coil 26 during a reception mode. The transmission and reception switch 34 may be controlled by a control signal output by an RF controller 56.

The monitoring unit 40 may monitor or control the gantry 20 and/or devices mounted on the gantry 20. The monitoring unit 40 may include a system monitoring unit (also referred to herein as a "system monitor") 42, an object monitoring unit (also referred to herein as an "object monitor") 44, a table controller 46, and a display controller 48.

The system monitoring unit 42 may monitor and control a state of the magnetostatic field, a state of the gradient, a state of the RF signal, a state of the RF coil 26, a state of the table 28, a state of a device measuring body information of the object 10, a power supply state, a state of a thermal exchanger, and a state of a compressor.

The object monitoring unit 44 monitors a state of the object 10. In detail, the object monitoring unit 44 may include any of a camera for observing a movement or position of the object 10, a respiration measurer for measuring the respiration of the object 10, an electrocardiogram (ECG) measurer for measuring the electrical activity of the object 10, and/or a temperature measurer for measuring a temperature of the object 10.

The table controller 46 controls a movement of the table 28 upon which the object 10 is positioned. The table controller 46 may control the movement of the table 28 based on a sequence control of a sequence controller 52. For example, during motion imaging of the object 10, the table controller 46 may cause the table 28 to continuously or discontinuously move based on the sequence control of the sequence controller 52, and thus the object 10 may be photographed in a field of view (FOV) which is larger than that of the gantry 20.

The display controller 48 controls the external display 29 disposed outside the gantry 20 and the internal display disposed inside the gantry 20. In detail, the display controller 48 may control the external display 29 and the internal display to be on or off, and may control a screen image to be output on the external display 29 and the internal display. Further, when a speaker is located inside or outside the gantry 20, the display controller 48 may control the speaker to be on or off, and/or may control sound to be output via the speaker.

The system control unit 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 based on a pulse sequence received from the operating unit 60. In this aspect, the pulse sequence includes all information required to control the gradient amplifier 32, the RF transmitter 36, the RF receiver 38, and the transmission and reception switch 34. For example, the pulse sequence may include information that relates to a strength, an application time, and an application timing of a pulse signal applied to the gradient coil 24.

The operating unit 60 may request the system control unit 50 to transmit pulse sequence information while controlling an overall operation of the MRI system.

The operating unit 60 may include an image processor 62 for receiving and processing the MR signal received by the RF receiver 38, an output unit (also referred to herein as an "output device") 64, and an input unit (also referred to herein as an "input device") 66.

The image processor 62 may process the MR signal received from the RF receiver 38 so as to generate MR image data that relates to the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may arrange digital data in a K-space (for example, also referred to herein as a "Fourier space" or as a "frequency space") of a memory, and rearrange the digital data into image data via 2D or 3D Fourier transformation.

The image processor 62 may perform a composition process or a difference calculation process with respect to the image data if required. The composition process may include an addition process performed on a pixel or a maximum intensity projection (MIP) process performed on a pixel. The image processor 62 may store not only the rearranged image data, but also image data on which a composition process or a difference calculation process is performed, in a memory (not shown) or an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The output unit 64 may output image data generated or rearranged by the image processor 62 to the user. The output unit 64 may also output information required for the user in order to manipulate the MRI system, such as a user interface (UI), user information, and/or object information. The output unit 64 may include any of a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, and/or any one of other various output devices that are well known to one of ordinary skill in the art.

The user may input object information, parameter information, a scan condition, a pulse sequence, or information that relates to image composition or difference calculation by using the input unit 66. The input unit 66 may include any of a keyboard, a mouse, a track ball, a voice recognizer, a gesture recognizer, a touch screen, and/or any one of other various input devices that are well known to one of ordinary skill in the art.

The signal transceiver 30, the monitoring unit 40, the system control unit 50, and the operating unit 60 are separate components in FIG. 1, but it will be apparent to one of ordinary skill in the art that respective functions of the signal transceiver 30, the monitoring unit 40, the system control unit 50, and the operating unit 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitoring unit 40, the system control unit 50, and the operating unit 60 may be connected to each other by wire or wirelessly, and when they are connected wirelessly, the MRI system may further include an apparatus (not shown) for synchronizing clock signals therebetween. Communication between the gantry 20, the RF coil 26, the signal transceiver 30, the monitoring unit 40, the system control unit 50, and the operating unit 60 may be performed by using any of a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, and/or any of other various communication methods that are well known to one of ordinary skill in the art.

Figure 2:
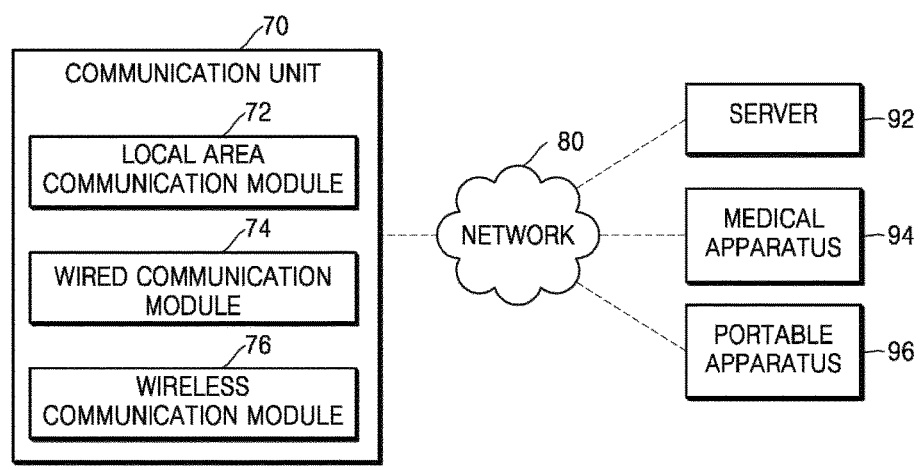
FIG. 2 is a block diagram of a communication unit of the MRI system of FIG. 1.

FIG. 2 is a block diagram of a communication unit 70, according to an exemplary embodiment. Referring to FIG. 2, the communication unit (also referred to herein as a "communicator") 70 may be connected to at least one selected from among the gantry 20, the signal transceiver 30, the monitoring unit 40, the system control unit 50, and the operating unit 60 of FIG. 1.

The communication unit 70 may transmit and receive data to and from a hospital server and/or to and from another medical apparatus in a hospital, which is connected via a picture archiving and communication system (PACS), and may perform data communication according to the digital imaging and communications in medicine (DICOM) standard.

As shown in FIG. 2, the communication unit 70 may be connected to a network 80 by wire or wirelessly in order to communicate with a server 92, a medical apparatus 94, and/or a portable device 96.

In detail, the communication unit 70 may transmit and receive data related to the diagnosis of an object via the network 80, and may also transmit and receive a medical image captured by the medical apparatus 94, such as a CT apparatus, an MRI apparatus, and/or an X-ray apparatus. In addition, the communication unit 70 may receive a diagnosis history or a treatment schedule of the object from the server 92 and use the same to facilitate a diagnosis of the object. The communication unit 70 may perform data communication not only with the server 92 or the medical apparatus 94 in a hospital, but also with the portable device 96, such as a mobile phone, a personal digital assistant (PDA), and/or a laptop of a doctor or patient.

Further, the communication unit 70 may transmit information that relates to a malfunction of the MRI system or information that relates to a medical image quality to a user via the network 80, and receive a feedback regarding the information from the user.

The communication unit 70 may include at least one component that facilitates communication with an external apparatus.

For example, the communication unit 70 may include a local area communication module 72, a wired communication module 74, and a wireless communication module 76. The local area communication module 72 refers to a module for performing local area communication with an apparatus within a predetermined distance. Examples of local area communication technology according to an exemplary embodiment include, but are not limited to, a wireless local area network (LAN), wireless fidelity (Wi-Fi), Bluetooth, ZigBee, Wi-Fi direct (WFD), ultra wideband (UWB), infrared data association (IrDA), Bluetooth low energy (BLE), and near field communication (NFC).

The wired communication module 74 refers to a module for performing communication by using an electric signal or an optical signal. Examples of wired communication technology according to an exemplary embodiment include wired communication techniques using any of a pair cable, a coaxial cable, and an optical fiber cable, and other well known wired communication techniques.

The wireless communication module 76 transmits and receives a wireless signal to and from at least one selected from among a base station, an external apparatus, and a server in a mobile communication network. In this aspect, the wireless signal may include any of a voice call signal, a video call signal, or data in any one of various formats according to transmission and reception of a text/multimedia message.

Figure 3:
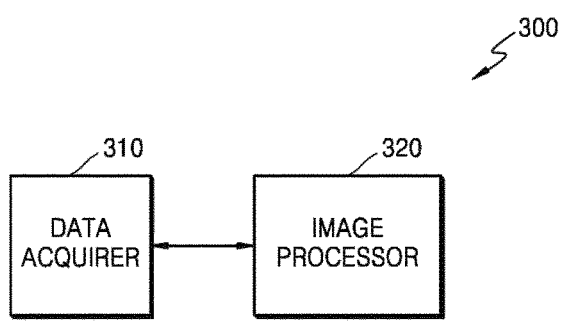
FIG. 3 is a block diagram of an MRI apparatus, according to an exemplary embodiment.

FIG. 3 is a block diagram of an MRI apparatus 300, according to an exemplary embodiment.

The MRI apparatus 300 according to an exemplary embodiment may include any type of apparatus that is capable of generating, processing, and/or displaying MR images. For example, the MRI apparatus 300 may be an MRI apparatus that uses MR signals acquired from a plurality of channel coils included in an RF multi-coil (not shown).

For example, the MRI apparatus 300 may be included in the MRI system described above with reference to FIGS. 1 and 2. When the MRI apparatus 300 is included in the MRI system of FIG. 1, a data acquirer 310 and an image processor 320 of FIG. 3 may respectively correspond to the signal transceiver 30 and the image processor 62 of FIG. 1.

Further, the MRI apparatus 300 may include an image processing apparatus that receives data acquired by MRI scanning of an object, e.g., an MR signal, and restores an MR image by using the received MR signal.

In addition, the MRI apparatus 300 may include a server apparatus that receives an MR signal acquired by MRI scanning an object and restores an MR image by using the received MR signal. The server apparatus may include a medical server apparatus that is located in a hospital where a patient is MRI scanned, or may be located in another hospital.

In particular, the MRI apparatus 300 may include the server 92, the medical apparatus 94, or the portable device 96 that are connected to the MRI system of FIGS. 1 and 2, and may receive MR signals from the MRI system and restore MR images.

Referring to FIG. 3, the MRI apparatus 300 according to an exemplary embodiment may include the data acquirer 310 and the image processor 320.

The data acquirer 310 may receive raw data for restoring MR images by MRI scanning of an object. The raw data may include MR signals in the form of RF signals respectively received from each of a plurality of channel coils in an RF multi-coil (not shown) due to an MRI scanning operation.

The RF multi-coil may correspond to the RF coil 26 of FIG. 1. Further, the data acquirer 310 may be connected to the RF receiver 38 of FIG. 1 and receive the MR signals from the RF receiver 38.

Alternatively, the data acquirer 310 may include the RF receiver 38 of FIG. 1. When the data acquirer 310 includes the RF receiver 38, the data acquirer 310 may independently receive the MR signals via the RF receiver 38. In particular, when the MRI apparatus 300 is included in the MRI system of FIG. 1, the data acquirer 310 of the MRI apparatus 300 may correspond to the signal transceiver 30 that includes the RF receiver 38.

Further, the data acquirer 310 may acquire K-space data by sampling the MR signals. The K-space data refers to signals generated by mapping RF signals received from coils in correspondence with channels in the RF multi-coil, i.e., the MR signals, in a K-space.

The RF multi-coil may include a plurality of channel coils that transmit and receive the RF signals. For example, the RF multi-coil may include n channel coils. Each of the n channel coils may individually receive a respective MR signal. The data acquirer 310 may use the MR signals from the n channel coil to receive n pieces of K-space data that respectively correspond to the n channel coils.

The K-space data may be 2-dimensional (2D) K-space data or 3D K-space data. For example, the 2D K-space data has a spatial frequency domain of a 2D space, and is formed by a Kx-axis that corresponds to frequency encoding and a Ky-axis that corresponds to phase encoding. Further, the 3D K-space data is formed by the Kx-axis, the Ky-axis, and a Kz-axis that corresponds to a proceeding direction of a space. The Kz-axis may correspond to slice selection gradients.

The data acquirer 310 may acquire an incomplete set of 3D K-space data by sampling MR signals emitted by the object in a 3D K-space. For example, the data acquirer 310 may acquire an incomplete set of 3D K-space data according to channels, and thus acquire a plurality of pieces of "incomplete" 3D K-space data that respectively correspond to the plurality of channel coils. In this aspect, the term 'incomplete 3D K-space data' refers to K-space data in which an MR signal of at least one point in a K-space is not sampled, and thus a signal of at least one point in the K-space has to be restored. Further, the 'incomplete 3D K-space data' may include data acquired by sampling MR signals received from the RF multi-coil, that is, raw data before performing unacquired signal restoration. In particular, the data acquirer 310 may acquire a plurality of pieces of incomplete 3D K-space data that respectively correspond to the plurality of channel coils by undersampling. For example, in order to restore a 2D image with a 256*256 resolution, image values (MR signal values) that correspond to some points in an image grid with 256*256 points may not be acquired due to undersampling. Further, unacquired signals may be restored by using acquired signals.

The data acquirer 310 may transmit the plurality of pieces of incomplete K-space data that respectively correspond to the plurality of channel coils to the image processor 320.

Heretofore, an example in which the data acquirer 310 samples the MR signals and acquires the plurality of pieces of incomplete 3D K-space data that respectively correspond to the plurality of channel coils is described. Alternatively, the data acquirer 310 may only receive the MR signals from the plurality of channel coils, and a sampling operation may be performed by the image processor 320. IN particular, the image processor 320 may sample the received MR signals and thereby acquire the incomplete 3D K-space data. Hereinafter, an example in which the data acquirer 310 acquires the incomplete 3D K-space data by performing the sampling operation will be described.

The data acquirer 310 may acquire a plurality of pieces of the incomplete 3D K-space data that respectively correspond to the plurality of channel coils by sampling the MR signals received from each of the plurality of channel coils in the RF multi-coil such that intervals between pairs of acquired signals that are mutually adjacent in a first axis direction of the 3D K-space are non-uniform.

The image processor 320 may restore complete 3D K-space data based on a spatial relationship between acquired signals included in the incomplete 3D K-space data. In particular, the image processor 320 may restore a complete set of 3D K-space data according to channels, and thus restore a plurality of pieces of 3D K-space data that respectively correspond to the plurality of channel coils in order to complete the set of 3D K-space data.

Operations of the data acquirer 310 and the image processor 320 will be described below with reference to FIGS. 4A to 11.

Figure 4A:
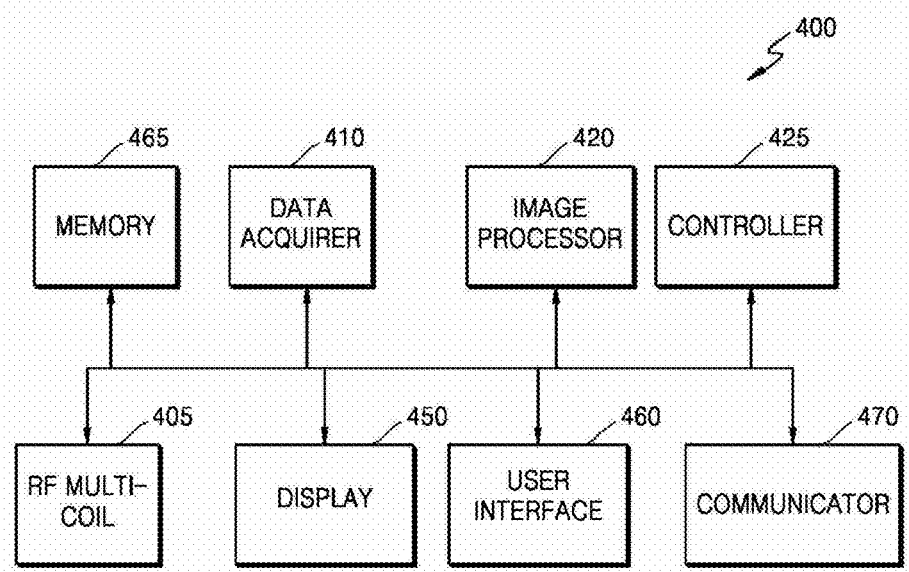
FIG. 4A is a block diagram of an MRI apparatus, according to another exemplary embodiment.

FIG. 4A is a block diagram of an MRI apparatus 400, according to another exemplary embodiment.

Referring to FIG. 4A, a data acquirer 410 and an image processor 420 of the MRI apparatus 400 according to an exemplary embodiment may respectively correspond to the data acquirer 310 and the image processor 320 of FIG. 3. Therefore, features of the MRI apparatus 400 which are the same as features of the MRI apparatus 300 of FIG. 3 will not be further described.

In comparison to the MRI apparatus 300 of FIG. 3, the MRI apparatus 400 may include at least one of an RF multi-coil 405, a controller 425, a display 450, a user interface 460, and a communicator 470.

The RF multi-coil 405, the controller 425, the display 450, the user interface 460, and the communicator 470 may be included in or correspond to the RF coil 26, the system control unit 50, the output unit 64, the input unit 66, and the communication unit 70 of FIGS. 1 and 2. Therefore, features already described with reference to FIGS. 1 and 2 will not be repeated herein.

The RF multi-coil 405 may correspond to the RF coil 26 of FIG. 1. The RF multi-coil 405 may include a plurality of channel coils. For example, the RF multi-coil 405 may include first to n-th channel coils, and each of the n channel coils may receive a respective MR signal that is an RF signal.

The RF multi-coil 405 may include a plurality of channel coils that apply a radio frequency signal to an object, and that receive respective MR signals that are radio frequency signals emitted by a nuclear spin of the object in response to the applied radio frequency signal.

The RF multi-coil 405 may stimulate the nuclear spin of the object by applying an RF signal to the object. Then, the nuclear spin of the object may transform into a high energy state due to the applied RF signal, and remaining energy is emitted externally as the nuclear spin returns to its original energy state. Energy emitted from the nuclear spin in this case becomes MR signals in the form of RF signals, and the RF multi-coil 405 detects MR signals emitted from the object. Then, the data acquirer 410 may sample the detected MR signals in the 3D K-space.

The data acquirer 410 may sample the respective MR signals received from each of the plurality of channel coils in the RF multi-coil 405. The data acquirer 410 may acquire a plurality of pieces of incomplete 3D K-space data that respectively correspond to the plurality of channel coils by sampling the MR signals received from the RF multi-coil 405 such that such that intervals between pairs of acquired signals that are mutually adjacent in the first axis direction of the 3D K-space are non-uniform. Sampling operations performed by the data acquirer 410 will be described below with reference to FIGS. 4B to 7.

The image processor 420 may restore a complete set of K-space data based on a relationship between signals in the incomplete 3D K-space data acquired by the data acquirer 410. The image processor 420 may restore unacquired signals that relate to the plurality of pieces of the incomplete 3D K-space data that respectively correspond to the plurality of channel coils, and thus restore a plurality of pieces of 3D K-space data that respectively correspond to the plurality of channel coils in order to complete the set of 3D K-space data. Operations performed by the image processor 420 to acquire the complete set of 3D K data will be described below with reference to FIGS. 8 to 11.

The controller 425 controls overall operations of the MRI apparatus 400. The controller 425 may set a sampling pattern when the data acquirer 410 samples MR signals in the 3D K-space. In the case that signals which correspond to some points of the 3D K-space are acquired and signals which correspond some other points of the 3D K-space are not acquired, the sampling pattern refers to a pattern formed by the acquired signals.

Hereinafter, a 'non-uniform sampling pattern' refers to a sampling pattern by which the data acquirer 410 samples the MR signals in the 3D K-space such that intervals between pairs of acquired signals that are mutually adjacent in the first axis direction of the 3D K-space are non-uniform.

The controller 425 may set the non-uniform sampling pattern. For example, the controller 425 may specifically set the non-uniform sampling pattern based on a required image quality of a restored MR image. Further, the controller 425 may specifically set the non-uniform sampling pattern based on at least one of a hardware shape of the RF multi-coil 405 and a scan object area.

The hardware shape of the RF multi-coil 405 may include a physical size and shape of the RF multi-coil 405. The scan object area may be classified according to body parts such as the head, neck, abdomen, back, ankles, and the like. For example, the RF multi-coil 405 for capturing the head may have a helmet shape. As another example, the RF multi-coil 405 for capturing the abdomen or legs may have a cylindrical shape. As another example, the RF multi-coil 405 for capturing the back may have a plate shape.

The non-uniform sampling pattern may vary based on whether the RF multi-coil 405 is configured for capturing the head, the neck, the abdomen, the back, the ankles, or any other body part or whether the RF multi-coil 405 has a helmet shape, a cylindrical shape, a plate shape, or the like.

Alternatively, the non-uniform sampling pattern may be set to a value that is determined based on results of experiments.

Alternatively, the non-uniform sampling pattern may be set by a user. The user may specifically set the non-uniform sampling pattern via the user interface 460. Then, based on settings input via the user interface 460, the controller 425 may control the data acquirer 410 such that the data acquirer 410 performs a sampling operation according to the non-uniform sampling pattern.

The display 450 may display a screen. The display 450 may include any of a CRT display, an LCD, a PDP, an OLED display, an FED, an LED display, a VFD, a DLP display, a FPD, a 3D display, a transparent display, and/or the like, and display a predetermined screen via any of the aforementioned displays.

The display 450 may display the restored MR image. Further, the display 450 may display a user interface screen for setting the non-uniform sampling pattern. Still further, the display 450 may sequentially display images generated during MR image restoration processes. In addition, the display 450 may display a screen that includes the set non-uniform sampling pattern such that the user may visually recognize the non-uniform sampling pattern applied to the sampling operation.

The user may input requests, commands, or other data via the user interface 460.

For example, the user interface 460 may include any of a mouse, a keyboard, and/or any other type of input device that includes hard keys for inputting predetermined data. Further, the user interface 460 may include a touchpad. In particular, the user interface 460 may include a touchpad (not shown) that is coupled to a display panel (not shown) in the display 450, and output a user interface screen on the display panel. In addition, when a command is input via the user interface screen, the touchpad may detect the command input by the user.

According to an exemplary embodiment, the user interface 460 may generate a user interface screen for setting the non-uniform sampling pattern, and detect user setting information that is input via the displayed user interface screen.

A memory device 465 may store data related to MR image restoration. In particular, the memory device 465 may store the plurality of pieces of the incomplete 3D K-space data that respectively correspond to the plurality of channel coils, which are acquired by the data acquirer 410. Further, the memory device 465 may store data calculated during image restoration processes, for example, the plurality of pieces of complete 3D K-space data, and the like. In addition, the memory device 465 may store the restored MR image.

The memory device 465 may store at least one non-uniform sampling pattern. For example, when a non-uniform sampling pattern is set by the user, the memory device 465 may store the non-uniform sampling pattern set by the user. Further, the memory device 465 may store a non-uniform sampling pattern set by the controller 425.

Since the communicator 470 corresponds to the communication unit 70 of FIG. 2, identical features of the communicator 470 and the communication unit 70 will not be repeatedly described.

According to an exemplary embodiment, the communicator 470 may receive the respective MR signal received from each of the plurality of channel coils. In particular, the communicator 470 may receive a detected MR signal from the RF receiver 38. Further, the communicator 470 may transmit the received MR signal to the data acquirer 410.

Figure 4B:
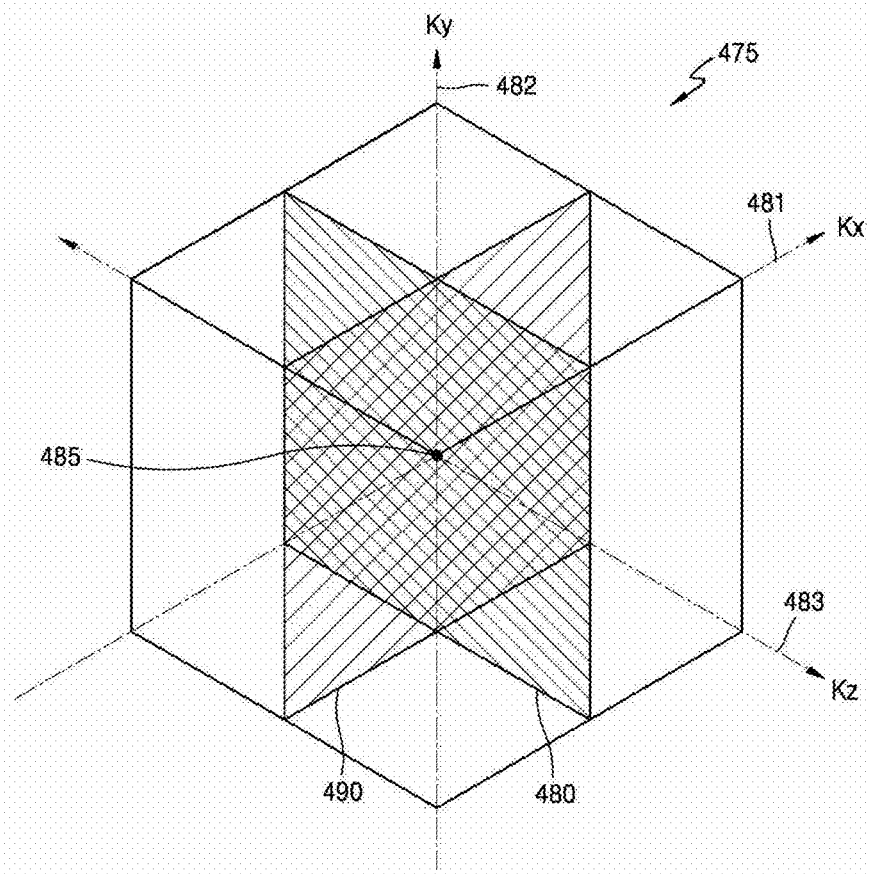
FIG. 4B is a diagram for describing a 3-dimensional (3D) K-space.

FIG. 4B is a diagram for describing a 3D K-space 475.

Referring to FIG. 4B, the data acquirer 410 may perform a sampling operation in the 3D K-space 475. The 3D K-space 475 is a space in a 3D spatial frequency domain, which may be formed by a Kx-axis 481 that corresponds to frequency encoding gradients, a Ky-axis 482 that corresponds to phase encoding gradients, and a Kz-axis 483 that corresponds to slice selection gradients. Further, a plane which is perpendicular to the Kz-axis 483 in the 3D K-space 475 may be a Kx-Ky plane 490, and a plane which is perpendicular to the Kx-axis 481 may be a Ky-Kz plane 480. Still further, in FIG. 4B, based on a central point 485, a central area of the 3D K-space 475 may be a low frequency space area and peripheral areas of the 3D K-space 475 may be radio frequency space areas.

The data acquirer 410 may perform the sampling operation in the 3D K-space 475. The data acquirer 410 may place a signal acquired by sampling in the 3D K-space 475 to acquire K-space data.

3D K-space data may be sampled by sampling MR signals for each of a plurality of slices that correspond to a plurality of Kx-Ky planes. Alternatively, regardless of slices, the MR signals may be sampled on the entire 3D K-space. Various methods of sampling 3D K-space data may be provided.

"Full sampling" refers to sampling signals at all points of a K-space. Full-sampled 3D K-space data is a complete set of 3D K-space data that does not include points at which signals are unacquired. The term 'point' refers to points that respectively correspond to pixels in an image with a desired resolution. In addition, 'undersampling' refers to a case when signals are sampled at only some points of the K-space instead of being sampled at all points of the K-space. Undersampled 3D K-space data is incomplete 3D K-space data that includes the points at which signals are unacquired.

According to an exemplary embodiment, the data acquirer 410 may undersample an MR signal according to a non-uniform sampling pattern and thus acquire an incomplete set of 3D K-space data, and the image processor 420 may restore unacquired signals from the incomplete 3D K-space data and thus acquire a complete set of 3D K-space data.

Figure 5A:
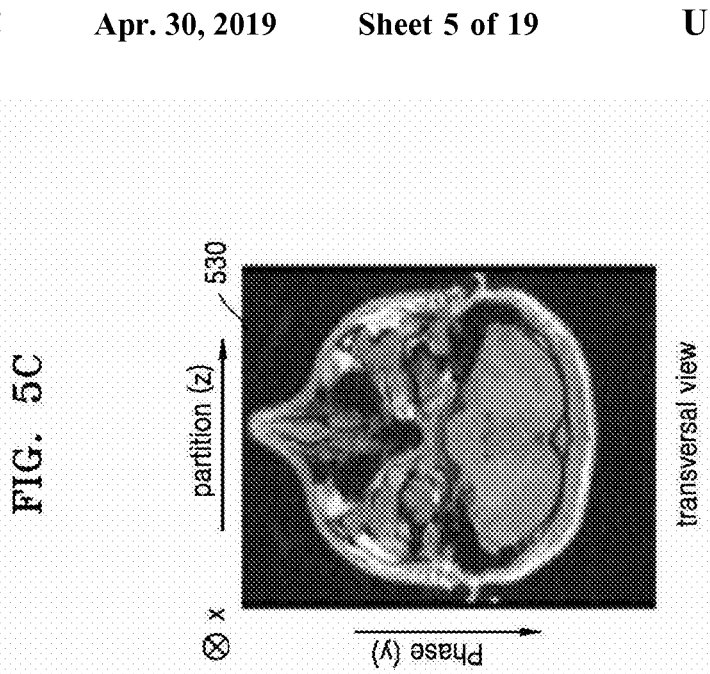
FIGS. 5A, 5B, and 5C are diagrams for describing magnetic resonance (MR) images acquired by sampling MR signals in a 3D K-space.
Figure 5B:
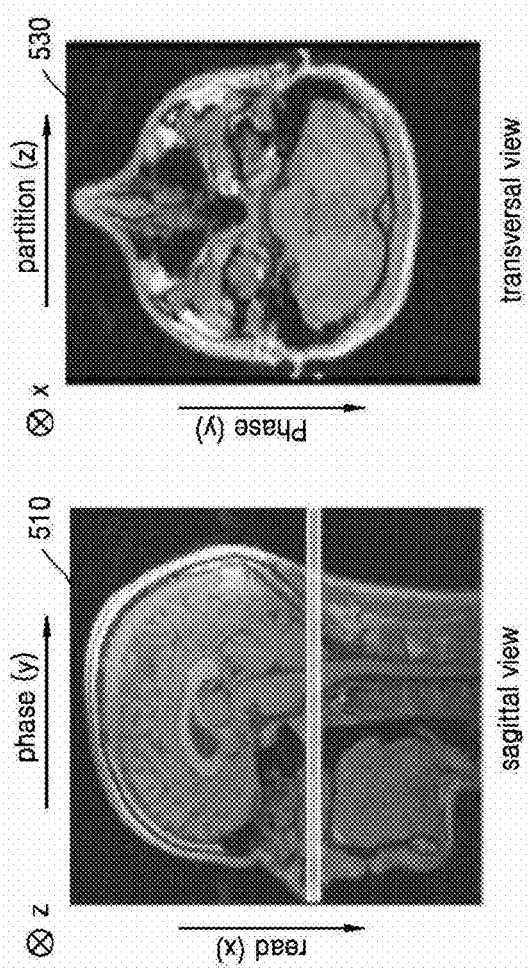
Figure 5C:
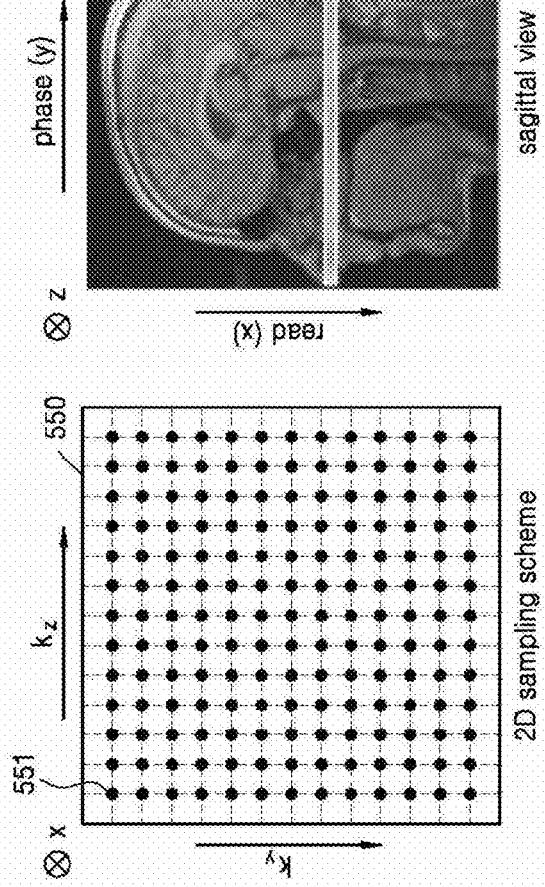

FIGS. 5A, 5B, and 5C are diagrams for describing MR images acquired by sampling MR signals in a 3D K-space.

FIG. 5A shows K-space data 550 of a Ky-Kz plane of 3D K-space data acquired by sampling the MR signals in the 3D K-space. In the K-space data 550, black points 551 on a grid indicate acquired signals. FIG. 5A shows an example in which signals are acquired at all points on the grid in the K-space data 550, i.e., the K-space data 550 is acquired by full sampling.

Further, when K-space data is acquired by undersampling, complete K-space data must be acquired by restoring unacquired signals from the undersampled K-space data, i.e., incomplete 3D K-space data, in order to restore an MR image. FIGS. 5B and 5C show MR images restored by using complete sets of K-space data.

Referring to FIG. 5B, an MR image 510 may be restored by using the 3D K-space data. The MR image 510 may show an object in a sagittal view. For example, the MR image 510 in the sagittal view may be restored by using K-space data on a Kx-Ky plane. For example, a slice may be set on a cross-section of an object to be restored, and by using K-space data on a Kx-Ky plane that corresponds to the slice, the MR image 510 may be restored.

FIG. 5C shows an MR image 530 in a transversal view that illustrates a cross-sectional plane of an object, i.e., a person's head, cut in a horizontal direction. For example, a slice may be set on a cross-section of an object to be restored, and by using K-space data of a Ky-Kz plane that corresponds to the slice, the MR image 530 may be restored.

Figure 6A:
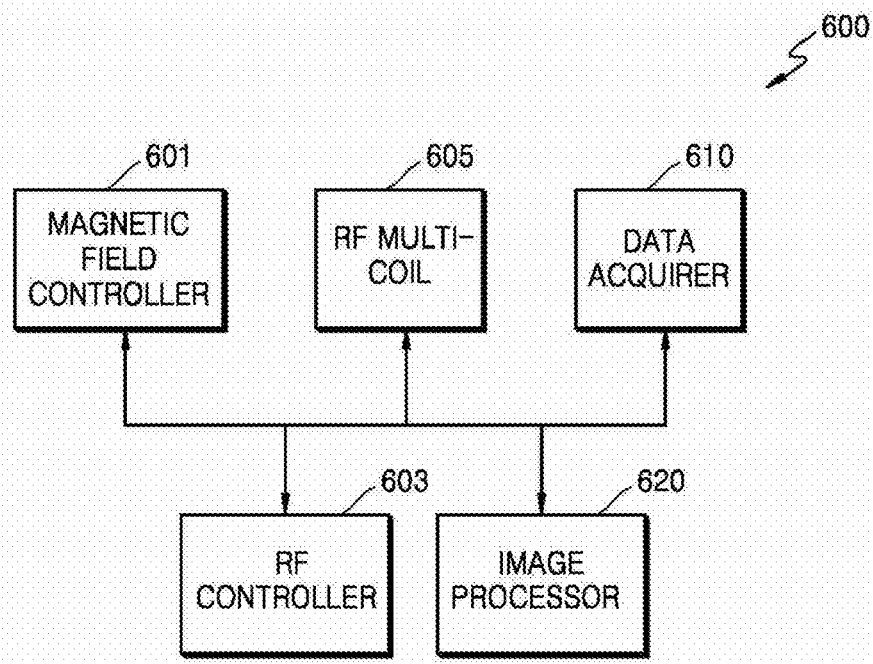
FIG. 6A is a block diagram of an MRI apparatus, according to another exemplary embodiment.

FIG. 6A is a block diagram of an MRI apparatus 600, according to another exemplary embodiment.

Referring to FIG. 6A, the MRI apparatus 600 according to an exemplary embodiment may include a gradient magnetic field controller 601, an RF controller 603, an RF multi-coil 605, and an image processor 620. The RF multi-coil 605 and the image processor 620 may respectively correspond to the data acquirer 310 and the image processor 320 of FIG. 3. Therefore, features of the MRI apparatus 600 which are the same as the features of the MRI apparatus 300 of FIG. 3 will not be further described.

In addition, the RF multi-coil 605, the data acquirer 610, and the image processor 620 may respectively correspond to the RF multi-coil 405, the data acquirer 410, and the image processor 420 of FIG. 4A. Furthermore, the MRI apparatus 600 may include at least one of the controller 425, the display 450, the user interface 460, and the communicator 470 of FIG. 4A. Therefore, the features of the MRI apparatus 600 which are the same as the features of the MRI apparatus 400 of FIG. 4A will not be further described.

Still further, the gradient magnetic field controller 601 and the RF controller 603 may respectively correspond to the gradient magnetic field controller 54 and the RF controller 56 of FIG. 1. Therefore, the features of the MRI apparatus 600 which are the same as the features of the MRI system of FIG. 1 will not be further described.

The RF controller 603 controls such that a plurality of RF signals that respectively correspond to a plurality of slices are applied to an object. The RF controller 603 may adjust transmission and reception directions of the RF signal and the MR signal. For example, the RF controller 603 may control the RF multi-coil 605 such that the RF signal is applied to the object via the RF multi-coil 605 during a transmission mode, and the MR signal is applied to the object via the RF multi-coil 605 during a reception mode. The RF controller 603 may generate control signals for controlling transmission of RF signals and reception of MR signals.

The gradient magnetic field controller 601 may modulate a first direction gradient that corresponds to a first slice from among the plurality of slices into a first state, and modulate a first direction gradient that corresponds to a second slice that is adjacent to the first slice from among the plurality of slices into a second state that is different from the first state.

The gradient magnetic field controller 601 may control a gradient coil (e.g., the gradient coil 24 of FIG. 1) to generate a spatial encoding gradient. Further, the spatial encoding gradient may include gradients in X-axis, Y-axis, and Z-axis directions. The gradient magnetic field controller 601 may apply pulse signals to X, Y, and Z coils that generate gradients in the X-axis, Y-axis, and Z-axis directions which cross each other at right angles. Further, in response to the applied pulse signals, gradients of X-axis, Y-axis, and Z-axis directions may be generated. The gradient coil (e.g., the gradient coil 24 of FIG. 1) that received the pulse signals from the gradient magnetic field controller 601 may provide location information of regions of an object and may variably induce resonance frequencies according to the regions of the object.

The spatial encoding gradient may be expressed on a 3D K-space, and the aforementioned gradients of X-axis, Y-axis, and Z-axis directions may respectively correspond to the Kx-axis 481, the Ky-axis 482, and the Kz-axis 483 of FIG. 4B. The gradients of X-axis, Y-axis, and Z-axis directions may respectively correspond to a frequency encoding gradient, a phase encoding gradient, and a slice selection gradient, according to exemplary embodiments, a gradient in a frequency encoding direction may correspond to a gradient in the Y-axis direction of the K-space, i.e., a gradient in a Ky-axis direction.

In order to acquire the MR signal, as described above with reference to FIG. 1, a magnetostatic field and a gradient are formed in the bore in the gantry 20, and the RF signal is emitted toward the object 10. Then, the MR signal that corresponds to the emitted RF signal is received.

In order to generate the first direction gradient, the gradient magnetic field controller 601 may generate a pulse signal to be applied to a first direction coil in the gradient coil (e.g., the gradient coil 24 of FIG. 1) as a pulse that corresponds to the first state in the first slice and as a pulse that corresponds to the second state in the second slice.

The gradient magnetic field controller 601 may variably modulate the first direction gradient in at least two adjacent slices so as to acquire the incomplete 3D K-space data with the non-uniform sampling pattern.

In particular, the gradient magnetic field controller 601 may variably generate a phase encoding gradient according to slices so that the incomplete 3D K-space data with the non-uniform sampling pattern is acquired.

The RF multi-coil 605 may apply a plurality of RF signals to the object in the spatial encoding gradient that includes the first direction gradient, and receive a first MR signal that corresponds to the first slice and a second MR signal that corresponds to the second slice.

The RF multi-coil 605 acquires the incomplete 3D K-space data by sampling the first MR signal and the second MR signal. In order to generate a 3D MR image, a plurality of slices may be set and respective MR signals may be acquired according to the slices. In particular, the MR signals may be sampled according to the plurality of slices in the 3D K-space.

The image processor 620 may restore the complete set of 3D K-space data based on respective relationships between acquired signals in the incomplete 3D K-space data.

Further, each of a plurality of channel coils in the RF multi-coil 605 of the MRI apparatus 600 may receive the MR signal, and thus, a plurality of pieces of incomplete 3D K-space data that respectively correspond to the plurality of channel coils may be acquired. In addition, a final MR image may be generated by using a plurality of pieces of a complete set of 3D K-space data that respectively correspond to the plurality of channel coils.

Operations of the MRI apparatus 600 will be described below with reference to FIGS. 6B and 6C.

FIG. 6B is a diagram for describing the operations of the MRI apparatus 600 of FIG. 6A.

The MRI apparatus 600 may apply an RF signal to the object, and receive an MR signal that is emitted by at least one slice during one repetition time (TR).

Referring to a graph 625 of FIG. 6B, the RF controller 603 may control an application of the RF signals 622 and 624 which respectively correspond to the plurality of slices to the object. The RF controller 603 may sequentially apply the RF signals 622 and 624 to the object according to certain time intervals (e.g., 1 TR).

Further, the gradient magnetic field controller 601 may control a slice selection gradient ($G_{slice}$) 630, a frequency encoding gradient ($G_{frequency}$) 640, and a phase encoding gradient ($G_{phase}$), 650.

Referring to FIG. 6B, the RF signal 622 that corresponds to a first slice and the RF signal 624 that corresponds to a second slice adjacent to the first slice may be sequentially applied to the object. The gradient magnetic field controller 601 may apply the slice selection gradient 630 that includes a pulse 631 for selecting the first slice and a pulse 632 for selecting the second slice. Further, the gradient magnetic field controller 601 may apply the frequency encoding gradient 640 to acquire X-axis direction spatial information and apply the phase encoding gradient 650 to acquire Y-axis direction spatial information.

The gradient magnetic field controller 601 may apply the frequency encoding gradient 640 that includes a pulse 641 for acquiring the X-axis direction spatial information in the first slice and a pulse 642 for acquiring the X-axis direction spatial information in the second slice. Further, the gradient magnetic field controller 601 may apply the phase encoding gradient 650 that includes a pulse 656 for acquiring the Y-axis direction spatial information in the first slice and a pulse 657 for acquiring the Y-axis direction spatial information in the second slice.

After the RF signals 622 and 624 are applied to the gantry 20 in which the gradient is formed, the RF multi-coil 605 may receive MR signals 651 and 652 that are emitted from the object. The MRI apparatus 600 may acquire K-space data 635 that corresponds to the first slice by using the MR signal 651 that is received in response to the RF signal 622, and acquire K-space data 645 that corresponds to the second slice by using the MR signal 652 that is received in response to the RF signal 624.

The K-space data 635 in the incomplete 3D K-space data may be data that corresponds to the first slice, and the K-space data 645 may be data that corresponds to the second slice. In particular, the K-space data 635 and the K-space data 645 may be incomplete 3D K-space data that is sampled on a Kx-Ky plane, a Ky-Kz plane, or a Kx-Kz plane in the 3D K-space.

The gradient magnetic field controller 601 may modulate the first direction gradient such that an interval between adjacent signals sampled from lines arranged in the first axis direction of the incomplete 3D K-space data varies with respect to the first and second slices that are adjacent to each other.

Hereinafter, an example in which the first and second slices are set on the Kx-Ky plane, the first axis direction is the Y-axis or the Ky-axis direction, and the first direction gradient is the phase encoding gradient 650 that corresponds to the Ky-axis direction will be described with reference to FIG. 6B.

The gradient magnetic field controller 601 may modulate the phase encoding gradient such that an interval between acquired signals that are adjacent to one another on a line parallel to a phase encoding direction of the incomplete 3D K-space data is a first interval in the first slice and is a second interval which is different from the first interval in the second slice.

For example, an interval between adjacent signals that are sampled from a line 636 arranged in the Ky-axis direction may be equal to 1. The Ky-axis direction in this case may be the first axis direction of the K-space data 635 that is sampled in response to the first slice. Then, the gradient magnetic field controller 601 may modulate the pulse 656 that corresponds to the first slice and the pulse 657 that corresponds to the second slice, such that the an interval between adjacent signals that are sampled from a line 646 arranged in the Ky-axis direction may be equal to 2. The Ky-axis direction in this case may be the first axis direction of the K-space data 645 that is sampled in response to the second slice.

The gradient magnetic field controller 601 may modulate a shape of pulses in the first direction gradient that corresponds to the first slice differently from a shape of pulses in the first direction gradient that corresponds to the second slice. For example, the gradient magnetic field controller 601 may modulate a shape of pulses in the phase encoding gradient 656 that corresponds to the first slice differently from a shape of pulses in the phase encoding gradient 657 that corresponds to the second slice. Amplitudes of pulses in the phase encoding gradient 656 may be variably set in a plurality of adjacent slices. Since the phase encoding gradients 656 and 657 for acquiring K-space data such as the K-space data 635 and 645 of FIG. 6B may be variably set, detailed description of the shapes of the pulses in the phase encoding gradients 656 and 657 will be omitted.

As described above, the MRI apparatus 600 may apply a variable gradient such that intervals between lines in a plurality of pieces of K-space data that respectively correspond to the plurality of slices vary.

FIG. 6C is another diagram for describing operations of the MRI apparatus 600 of FIG. 6A. Features shown in FIG. 6C which are the same as those shown in FIG. 6B are indicated by using the same reference numerals as FIG. 6B and will not be repeatedly described.

Referring to FIG. 6C, the MRI apparatus 600 may acquire the K-space data 635 that corresponds to a first slice by using the MR signal 651 received in response to the RF signal 622, and acquire the K-space data 645 that corresponds to a second slice by using the MR signal 652 received in response to the RF signal 624. Further, the MRI apparatus 600 may acquire K-space data 655 that corresponds to a third slice by using an MR signal 653 received in response to an RF signal 626, and acquire K-space data 665 that corresponds to a fourth slice by using an MR signal 654 received in response to an RF signal 628. The first, second, third, and fourth slices may be sequentially adjacent to each other.

The gradient magnetic field controller 601 may apply the variable gradient such that intervals between signal lines that are sampled from each of a plurality of planes in the 3D K-space which correspond to the plurality of slices that are sequentially adjacent to one another.

In particular, the gradient magnetic field controller 601 may modulate the first direction gradient into the aforementioned first state and apply the first direction gradient in at least one first slice that includes the first slice from among the plurality of slices, and modulate the first direction gradient into the aforementioned second state and apply the first direction gradient in at least one second slice that includes the second slice, and modulate the first direction gradient into a third state and apply the first direction gradient in at least one third slice that is adjacent to the at least one second slice. The third state may be different from the first and second states.

For example, the gradient magnetic field controller 601 may modulate the phase encoding gradient 656 into the first state in the first slice, modulate the phase encoding gradient 657 and a phase encoding gradient 658 into the second state in the second and third slices which are sequentially adjacent to the first slice, and modulate a phase encoding gradient 659 into the third state in the fourth slice which is adjacent to the third slice. Further, the phase encoding gradient may be modulated such that signal lines acquired in the K-space data 645 and 655 that respectively corresponds to the second and third slices are interleaved.

Accordingly, an interval between adjacent signal lines may be equal to 1 in the K-space data 635 that corresponds to the first slice, and an interval between adjacent signal lines may be equal to 2 in the K-space data 645 and 655 that respectively corresponds to the second and third slices, and the K-space data 665 that corresponds to the fourth slice may be infinity (i.e., MR signals are not sampled in the K-space data 665).

As described above, incomplete 3D K-space data that is acquired by applying a variable phase encoding gradient according to slices will be described below with reference to FIGS. 7A, 7B, and 7C.

Figure 6D:
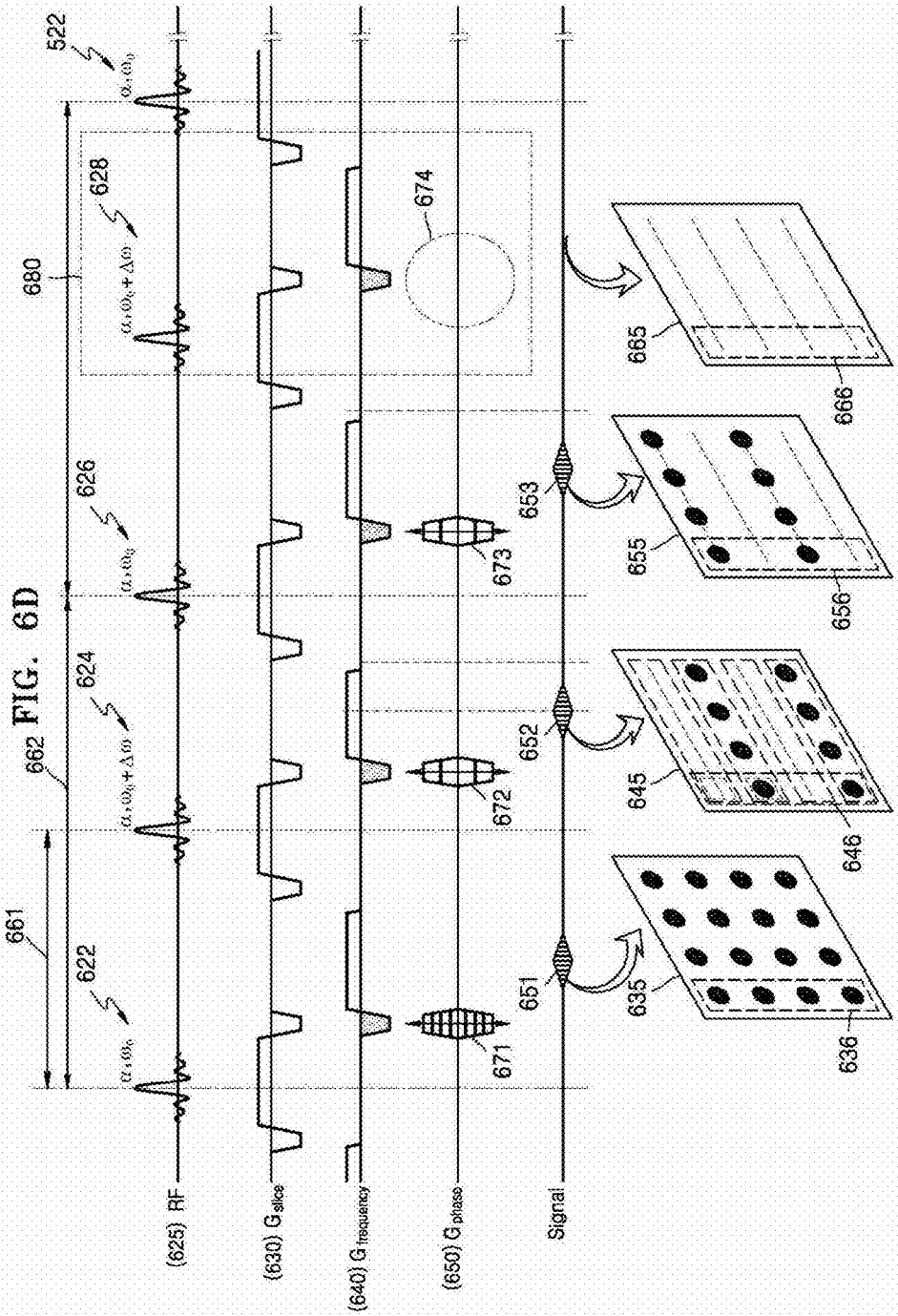
FIG. 6D is another diagram for describing operations of the MRI apparatus of FIG. 6A.

FIG. 6D is another diagram for describing operations of the MRI apparatus 600 of FIG. 6A. Features shown in FIG. 6D which are the same as those shown in FIGS. 6B and 6C are indicated by using the same reference numerals as FIGS. 6B and 6C and will not be repeatedly described.

Referring to FIG. 6D, a phase encoding gradient 671 that corresponds to a first slice may be applied such that an interval between pulses is a first interval and full-sampled K-space data 636 is acquired. Further, phase encoding gradients 672 and 673 that respectively correspond to second and third slices may be applied such that an interval between pulses is a second interval so that undersampled K-space data 646 and 656 are acquired. The first interval may be shorter than the second interval. Further, a phase encoding gradient may be not applied to a section that corresponds to a fourth slice. Since the K-space data 665 that corresponds to the fourth slice is not sampled, a gradient may be not applied in a section 680 that corresponds to the fourth slice. Therefore, as shown in a dashed area 674, a pulse of a phase encoding gradient may be not applied to a section that corresponds to the fourth slice.

Further, the gradient magnetic field controller 601 may divide a 3D K-space that corresponds to the incomplete 3D K-space data into a plurality of blocks, and modulate a first direction gradient according to divided 3D K-spaces. For example, a variable phase encoding gradient may be applied according to the divided 3D K-spaces.

Further, the gradient magnetic field controller 601 may variably modulate at least one of a first state that corresponds to the first slice and a second state that corresponds to the second slice, in at least two of the plurality of divided blocks.

Division of the 3D K-space will be described below with reference to FIGS. 10A, 10B, and 10C.

In addition, the MRI apparatus 600 may apply the RF signal (or RF pulse) 622 during one repetition time (TR) 661, or apply the RF signals 622 and 624 during one repetition time 662. With regard to the former, a method of acquiring an MR single that corresponds to one slice by applying the RF signal 622 during the repetition time 661 may be referred to as a single slice method. Further, with regard to the latter, a method of acquiring MR signals that respectively correspond to a plurality of slices by applying the RF signals 622 and 624 during the repetition time 662 may be referred to as a multi-slice method. The MRI apparatus 600 may use both the single slice method and the multi-slice method.

Figure 7A:
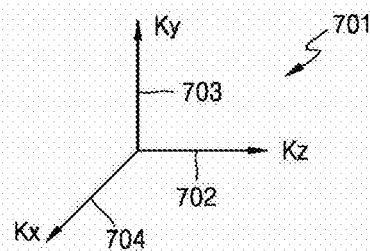
FIGS. 7A, 7B, and 7C are diagrams for describing an MR image sampling operation, according to an exemplary embodiment.
Figure 7B:
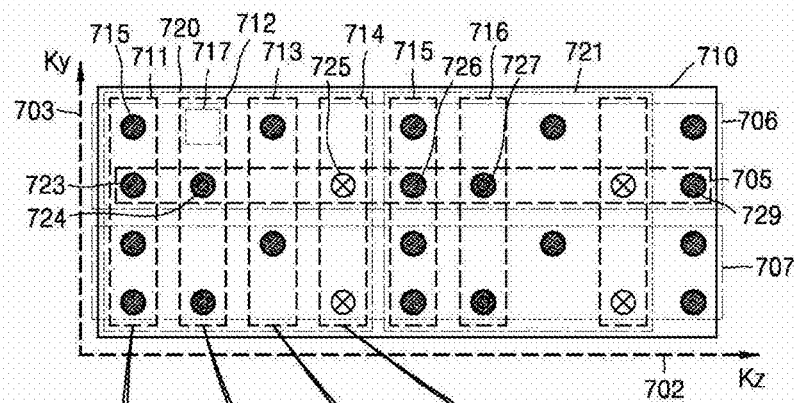
Figure 7C:
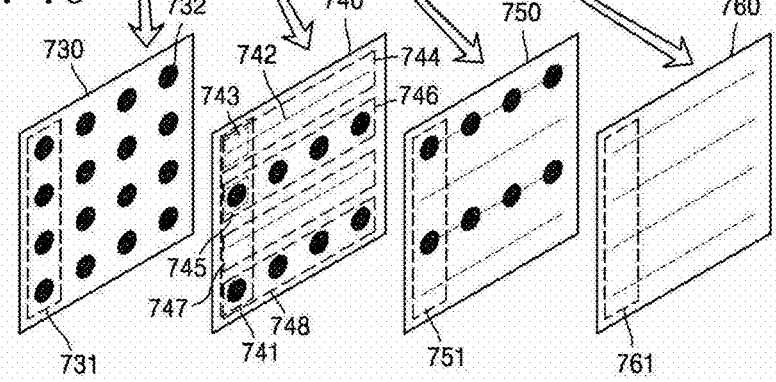

FIGS. 7A, 7B, and 7C are diagrams for describing an MR image sampling operation, according to an exemplary embodiment.

Referring to FIG. 7A, a 3D K-space is shown with a Kx-axis 704, a Ky-axis 703, and a Kz-axis 702, as described above.

Referring to FIG. 7B, K-space data 710 on a plane which is perpendicular to the Kx-axis 704, i.e., a Ky-Kz plane, is shown. In particular, FIG. 7B shows the K-space data 710 at a cross-section of the incomplete 3D K-space data acquired by sampling the MR signal received by applying the RF signal and the gradient, which is described above with reference to FIGS. 6B and 6C.

According to an exemplary embodiment, the K-space data 710 indicates K-space data on the Ky-Kz plane in a single piece of incomplete 3D K-space data that corresponds to one channel coil acquired by acquired by the sampling of the data acquirer 410.

In the K-space data 710, an acquired signal is shown as a black circle 715, and a signal at a non-sampled point, i.e., an unacquired signal, is shown as a colorless circle 725 or without any mark 717.

The data acquirer 410 may acquire the incomplete 3D K-space data by sampling the MR signals such that intervals between pairs of acquired signals that are mutually adjacent in a first axis direction are non-uniform. With regard to a line 705 in a first axis direction of FIG. 7B, the MR signals are sampled such that intervals between pairs of acquired signals that are adjacent in the first axis direction, for example, in the Kz-axis 702 direction, are non-uniform. Referring to the line 705 of FIG. 7B, an acquired signal 723 and an acquired signal 724 adjacent to the acquired signal 723 are one column apart, but the acquired signal 724 and an acquired signal 726 adjacent to the acquired signal 724 are three columns apart, and the acquired signal 726 and an acquired signal 727 adjacent to the acquired signal 726 are one column apart. Similarly, in the incomplete 3D K-space data that is sampled according to a non-uniform sampling pattern, acquired signals that are adjacent to each other on the line 705 in the first axis direction, for example, the Kz-axis 702 direction, are spaced apart by non-uniform intervals, such as one column—three columns—one column. Accordingly, a sampling pattern that corresponds to when two adjacent signals are not uniformly spaced apart on a line parallel to the first axis direction may be referred to as a 'non-uniform sampling pattern.' Conversely, two adjacent signals at an axis in the 3D K-space may be spaced apart by identical intervals in a 'uniform sampling pattern.'

Further, when each line that is perpendicular to a first axis, for example, the Kz-axis 702, is referred to as a 'column,' one column apart' indicates that a column (e.g., a column 711) is directly adjacent to another column (e.g., a column 712). In particular, the column 711 and the column 712 are 'one column apart,' and the column 712 and a column 715 are 'three columns apart,' and the column 715 and a column 716 are 'one column apart.'

At least one line 705 that is formed in a direction parallel to the first axis in the incomplete 3D K-space data, for example, the Kz-axis 702, may be sampled according to the non-uniform sampling pattern in which intervals between pairs of adjacent acquired signals are non-uniform.

As described above, the non-uniform sampling pattern may indicate a pattern formed by signals acquired on the line 705 parallel to the first axis (e.g., the Kz-axis 702.

Further, when a pattern formed by signals acquired at a plurality of lines parallel to a first axis in the K-space data 710, for example, the Kz-axis 702, is repeated, the non-uniform sampling pattern may indicate a pattern formed by signals acquired in a block formed by a plurality of lines parallel to the Kz-axis 702. For example, an identical pattern is formed by signals acquired in a block 706 and a block 707 in the K-space data 710. The signals acquired in the block 706 are not uniformly spaced apart. In this case, a pattern formed by the signals acquired in the block 706 may be referred to as a non-uniform sampling pattern.

Still further, from among acquired line data 711, 712, 713, and 714 which are parallel to a second axis direction 703 that is perpendicular to the first axis direction (the Kz-axis 702 direction) in the incomplete 3D K-space data, pairs of adjacent pieces of acquired line data may be not uniformly spaced apart, and thus a non-uniform sampling pattern may be formed. In particular, a pattern formed by signals acquired in a block 720 formed by the acquired line data 711, 712, 713, and 714 may be referred to as the non-uniform sampling pattern.

In addition, the non-uniform sampling pattern may be repeated a plurality of times in the 3D K-space. In particular, the non-uniform sampling pattern may be repeated throughout an entirety of the 3D K-space. For example, a non-uniform sampling pattern formed by the signals acquired in the block 720 may be repeated in the block 720 and a block 721. Further, the non-uniform sampling pattern may be repeated in some areas of the 3D K-space.

Still further, the data acquirer 410 may sample the MR signals such that intervals between pairs of acquired signals that are adjacent in the first axis direction of the entirety of the 3D K-space is non-uniform, and acquire the plurality of pieces of the incomplete 3D K-space data that respectively correspond to the plurality of channel coils.

In the incomplete 3D K-space data acquired by the data acquirer 410, every Kx point that corresponds to a point sampled in the K-space data 710 on the Ky-Kz plane may be sampled. FIG. 7C shows K-space data on the Kx-Ky planes in the incomplete 3D K-space data acquired by the data acquirer 410.

Referring to FIG. 7C, K-space data 730 is K-space data on the Kx-Ky plane that corresponds to the column 711, which in turn corresponds to a column 731. Further, K-space data 740 is K-space data on the Kx-Ky plane that corresponds to the column 712, which in turn corresponds to a column 741. Still further, K-space data 750 is K-space data on the Kx-Ky plane that corresponds to a column 713, which in turn corresponds to a column 751. Still further, K-space data 760 is K-space data on the Kx-Ky plane that corresponds to a column 714, which in turn corresponds to a column 761. In addition, a non-sampled line is shown with dashes 742 in FIG. 7C.

Further, referring to FIG. 7C, the K-space data 730, the K-space data 740, the K-space data 750, and the K-space data 760 may respectively correspond to the K-space data 635, the K-space data 645, the K-space data 655, and the K-space data 665 of FIG. 6C.

All Kx points that correspond to points sampled in the K-space data 710 on the Ky-Kz plane may be sampled. In the K-space data 740 for example, a point 743 not sampled in the column 741 may be not sampled at all points of a row 744 that is parallel to the Kx-axis 704 which includes the point 743, and a point 745 sampled in the column 741 may be sampled at all points of a row 746 that is parallel to the Kx-axis 704 which includes the point 745.

In particular, as shown in FIG. 7C, the data acquirer 410 may acquire incomplete 3D K-space data formed of a plurality of planes that include at least one first plane (e.g., 730) that is full-sampled, at least one second plane (e.g., 740 and 750) that is regularly undersampled, and at least one third plane (e.g., 760) that is not sampled. The at least one first plane, the at least one second plane, and the at least one third plane may be perpendicular to a first axis (e.g., the Kz-axis 702) and adjacent to one another. Further, 'regularly undersampling' indicates that intervals between successive acquired signal lines are identical. For example, in K-space data (e.g., 740 or 750) on a second plane, all successive acquired signal lines may be two rows apart. For example, referring to the K-space data (e.g., 740) on the second plane, signals may be acquired in the line 746, signals may be not acquired on a line 747 adjacent to the row 746, and signals may be acquired on a line 748 following the line 747. Accordingly, the row 746 and the line 748 where the signals are two rows apart.

Further, the incomplete 3D K-space data may be formed by K-space data (e.g., 710) that corresponds to a plurality of Ky-Kz planes that are perpendicular to the Kx-axis 704. Alternatively, the incomplete 3D K-space data may be formed by K-space data (e.g., 730) that corresponds to a plurality of Kx-Ky planes that are perpendicular to the Kz-axis 702.

Figure 8A:
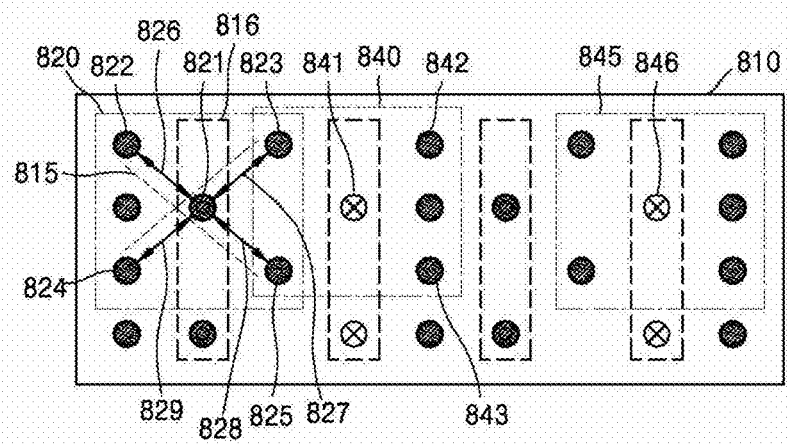
FIGS. 8A, 8B, and 8C are diagrams for describing restoration of 3D K-space data, according to an exemplary embodiment.
Figure 8B:
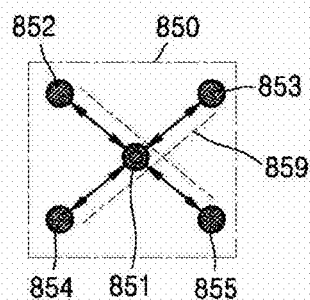
Figure 8C:
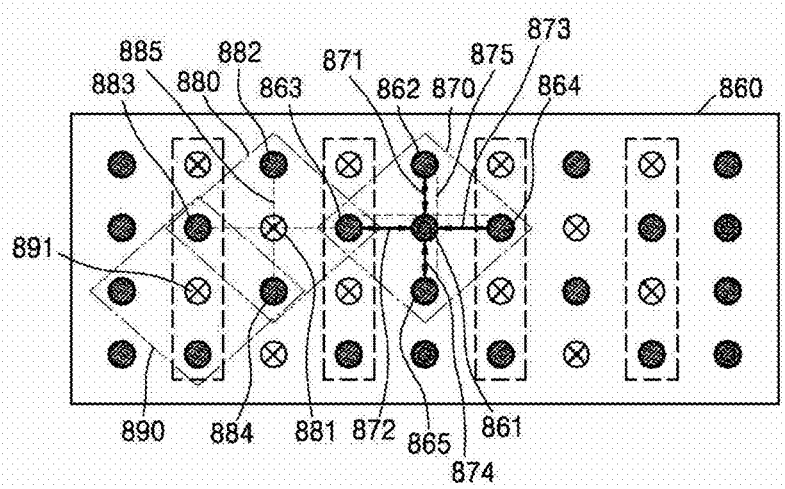

FIGS. 8A, 8B, and 8C are diagrams for describing a restoration of 3D K-space data, according to an exemplary embodiment. K-space data 810 of FIG. 8A corresponds to the K-space data 710 of FIG. 7B, and a column 816 corresponds to the column 712 of FIG. 7B. Therefore, features already described with reference to FIGS. 7A, 7B, and 7C will not be repeated herein.

The image processor 420 may restore a complete set of 3D K-space data based on respective relationships between acquired signals in incomplete 3D K-space data.

In particular, the image processor 420 may determine a first spatial correlation coefficient based on a spatial relationship between a reference signal and a plurality of other signals acquired from the incomplete 3D K-space data. Further, the image processor 420 may restore at least one unacquired signal that relates to the incomplete 3D K-space data based on the spatial relationship and the determined first spatial correlation coefficient.

FIG. 8A shows an example in which an unacquired signal that relates to the K-space data 810 which corresponds to a plane in the incomplete 3D K-space data is restored.

For example, the image processor 420 may determine the first spatial correlation coefficient based on a spatial relationship between a reference signal 821 acquired in the incomplete 3D K-space data and other acquired signals 822, 823, 824, and 825. The spatial relationship may indicate a relationship that corresponds to a respective spatial interval between the reference signal 821 and each of the other acquired signals 822, 823, 824, and 825. In particular, a spatial relationship may be defined according to an interval between the reference signal 821 and each of the other acquired signals 822, 823, 824, and 825. Referring to FIG. 8A, when respective intervals between the reference signal 821 and the other acquired signals 822, 823, 824, and 825 have a value 826, a value 827, a value 828, and a value 829, and the respective intervals form a shape (hereinafter, 'X' shape) 815 as shown in a block 820, the reference signal 821 and the other acquired signals 822, 823, 824, and 825 may have a 'first spatial relationship.' Although the other acquired signals 822, 823, 824, and 825 are located on an identical Ky-Kz plane in FIG. 8A for convenience of description, acquired signals that form the first spatial relationship with the reference signal 821 may be located at a Ky-Kz plane that is different from a Ky-Kz plane where the reference signal 821 is located. In order to acquire the first spatial correlation coefficient, any one of the acquired signals may be set as a reference signal, and a relationship between the reference signal and other acquired signals may be defined as the 'first spatial relationship.'

FIG. 9A is a diagram for describing an acquisition of a spatial correlation coefficient.

When first spatial relationship between the reference signal 821 and the other acquired signals 822, 823, 824, and 825 is defined, the first spatial correlation coefficient may be acquired by using the reference signal 821 and the other acquired signals 822, 823, 824, and 825 that satisfy the first spatial relationship. In drawing (a) of FIG. 9A, an acquired signal 951 corresponds to the other acquired signals 822, 823, 824, and 825, a reference signal 952 corresponds to the reference signal 821, and an unacquired signal 953 corresponds to an unacquired signal 841.

Referring to drawing (a) of FIG. 9A, a left side 910 of a matrix equation includes signal values of other acquired signals, and the right side 920 of the matrix equation includes a signal value of a reference signal. In addition, Kc indicates a spatial correlation coefficient.

Further, a plurality of signal values of the right side 920 may correspond to signal values which include the reference signal 821 on a line (the row 746 of FIG. 7C) that is parallel to a Kx-axis. Still further, the left side 910 may include signal values on lines parallel to the Kx-axis that include the other acquired signals 822, 823, 824, and 825.

In particular, a spatial correlation coefficient is a spatial interaction value between a predetermined signal value and adjacent estimated signal values. A target signal value to be estimated may be calculated by performing a matrix calculation that uses the adjacent signals and the spatial correlation coefficient.

Referring to drawing (a) of FIG. 9A, the left side 910 may include the other acquired signals 822, 823, 824, and 825, and the right side 920 may include the signal value of the reference signal 821. Therefore, since the left side 910 and the right side 920 are all acquired signal values, a first spatial correlation coefficient that is the spatial correlation coefficient Kc may be determined by calculating an inverse of a matrix shown in drawing (a) of FIG. 9A.

In this case, the spatial correlation coefficient Kc may be referred to as convolution kernels or a weighting matrix W.

Further, the aforementioned spatial correlation coefficient Kc and the aforementioned inverse matrix may be acquired and calculated by using any of various methods. In particular, the spatial correlation coefficient Kc and the inverse matrix calculation are described in the thesis "Introduction to Inverse Problems in Imaging" written by Mario Bertero and Patrizia Boccacci or "Inverse Problems Theory and Methods for Model Parameter Estimation" written by Albert Tarantola, and thus, a detailed description of the spatial correlation coefficient Kc and the inverse matrix calculation will be omitted. An exemplary formula for calculating the spatial correlation coefficient Kc will be described below with reference to FIGS. 10A, 10B and 10C.

When the first spatial correlation coefficient is determined, the image processor 420 may restore at least one unacquired signal that relates to the incomplete 3D K-space data based on the first spatial relationship and the first spatial correlation coefficient. In particular, when a first signal that is an unacquired signal that relates to the incomplete 3D K-space data and a plurality of acquired signals satisfy the first spatial relationship, the image processor 420 may acquire the first signal based on the determined first spatial correlation coefficient.

Referring to a block 850 shown in FIG. 8B, an unacquired signal 851 that forms an 'X' shape 859 with the other acquired signals 852, 853, 854, and 855 and satisfies a first spatial relationship, is set as a reference signal. Then, the unacquired signal 851 may be acquired by using a first spatial correlation coefficient. Features of the block 850 which are the same as those of the block 820 will not be repeatedly described.

Referring to drawing (b) of FIG. 9A, since the first spatial correlation coefficient Kc has been determined, signal values of the other acquired signals 852, 853, 854, and 855 are substituted in a left side 930, the left side 930 is multiplied by the first spatial correlation coefficient Kc, and thus, a right side 940 that includes a signal value of the unacquired signal 851, i.e., the reference signal, may be calculated. In this case, 'multiplying' may refer to matrix multiplication.

The image processor 420 may restore an unacquired signal in the K-space data 810 by using the method described with reference to drawing (b) of FIG. 9A. Referring to a block 840 of FIG. 8A, the unacquired signal 841 and acquired signals 823, 825, 842, and 843 form an 'X' shape 847 and thus satisfy the first spatial relationship. Therefore, the unacquired signal 841 is set as a reference signal. Therefore, as described with reference to drawing (b) of FIG. 9A, the unacquired signal 841 may be acquired by using the first spatial correlation coefficient and respective signal values of the acquired signals 823, 825, 842, and 843 that forms the 'X' shape 847 with the unacquired signal 841 and satisfy the first spatial relationship. Furthermore, the image processor 420 may set each of unacquired signals that satisfy the first spatial relationship with acquired signals as a reference signal, and thus restore the unacquired signals. For example, an unacquired signal 846 in a block 845 may be restored by using the method similarly as described above with respect to the block 840.

When the image processor 420 restores the unacquired signals that satisfy the first spatial relationship with the acquired signals by using the first spatial correlation coefficient, K-space data 860 shown in FIG. 8C may be acquired. Furthermore, in order to acquire a second spatial correlation coefficient for acquiring unacquired signals in the K-space data 860, the image processor 420 may define a second spatial relationship that is a spatial relationship between a reference signal that is one of the acquired signals and other acquired signals.

In particular, referring to FIG. 8C, the image processor 420 may define a spatial relationship based on respective intervals between a reference signal 861 that is a signal acquired in the K-space data 860 and other acquired signals 862, 863, 864, and 865. When the respective intervals between the reference signal 861 and the other acquired signals 862, 863, 864, and 865 have a value 871, a value 872, a value 873, and a value 874 and the respective intervals form a shape (hereinafter, '+' shape) 875 as shown in a block 870, the reference signal 861 and the other acquired signals 862, 863, 864, and 865 may have a 'second spatial relationship.'

When the second spatial relationship between the reference signal 861 and the other acquired signals 862, 863, 864, and 865 is defined, the second spatial correlation coefficient may be determined by using the reference signal 861 and the other acquired signals 862, 863, 864, and 865 that satisfy the second spatial relationship. Since the second spatial correlation coefficient may be calculated by using the same method as the first spatial correlation coefficient described with reference to FIG. 8A and FIG. 9A, detailed description of a method of calculating the second spatial correlation coefficient will be omitted.

When the second spatial correlation coefficient is acquired, the image processor 420 may restore at least one unacquired signal that relates to the incomplete 3D K-space data based on the second spatial relationship and the second spatial correlation coefficient. In particular, referring to a block 880, an unacquired signal 881 that forms a '+' shape 885 with other acquired signals 863, 882, 883, and 884 and satisfy the second spatial relationship is set as a reference signal, and the unacquired signal 881 may be acquired by using the second spatial correlation coefficient. Since a signal value of the unacquired signal 881 may be restored by using the same method as the signal value of the unacquired signal 851 described above with reference to FIG. 8B, a detailed description of the restoration method will be omitted.

In addition, the image processor 420 may set each of unacquired signals that satisfy the second spatial relationship with acquired signals in the K-space data 860 as a reference signal, and thus restore the unacquired signals. For example, all unacquired signals in the K-space data 860, including an unacquired signal 891 of a block 890, may be restored. Accordingly, the image processor 420 may restore the complete set of 3D K-space data in which signal values are at all points in the 3D K-space.

As described above, the MRI apparatus 400 may acquire a spatial correlation coefficient without using information about sensitivity with respect to channel coils or an auto-calibration signal (ACS) region that includes a plurality of lines that are full-sampled in 3D K-space data. In particular, the MRI apparatus 400 may determine at least one spatial correlation coefficient for restoring an unacquired signal by only using a spatial relationship between acquired signals included in incomplete 3D K-space data that is sampled according to a non-uniform sampling pattern. Further, a complete set of 3D K-space data may be acquired by using the determined at least one spatial correlation coefficient.

FIG. 9B is a diagram for describing setting of a sampling pattern according to blocks.

Referring to FIG. 9B, the controller 425 may divide a 3D K-space 960 into a plurality of blocks, and restore unacquired signals of each block. In particular, the image processor 420 may divide incomplete 3D K-space data into a plurality of blocks, and may restore a complete set of 3D K-space data of each block based on respective relationships between acquired signals in the divided K-space data.

Referring to FIG. 9B, the 3D K-space 960 may be divided into nine blocks. In particular, the 3D K-space 960 may be divided into three blocks in a Ky-axis 972 direction and three blocks in a Kz-axis 973 direction so that the 3D K-space 960 is divided into a total of nine blocks (3*3=9). Further, the unacquired signal restoration described with reference to FIGS. 8A, 8B, 8C and 9A may be performed on each block. As described with reference to FIGS. 7A, 7B, and 7C, a line that is parallel to the Kx-axis 704 may be full-sampled. Therefore, blocks may be not divided in a Kx-axis 971 direction, and thus, without block division, a line that is parallel to the Kx-axis 971 may be full-sampled.

In particular, a non-uniform sampling pattern formed by a line that is parallel to a first axis direction (e.g., the Kx-axis 971 direction) in the incomplete 3D K-space data may be the same in the plurality of blocks. Alternatively, the controller 425 may set a different non-uniform sampling pattern in at least one of the plurality of blocks.

In particular, the controller 425 may control the data acquirer 410 such that the data acquirer 410 acquires at least one additional signal from any one of the plurality of blocks. Further, the controller 425 may control the data acquirer 410 such that the data acquirer 410 acquires at least one less signal from any one of the plurality of blocks. Accordingly, the controller 425 may set a different non-uniform sampling pattern in at least one of the plurality of blocks. In particular, the non-uniform sampling pattern that is formed by the line that is parallel to the first axis direction of the incomplete 3D K-space data may vary with respect to at least two of the plurality of blocks.

In particular, the controller 425 may set a first non-uniform sampling pattern that corresponds to a block located in a central region of the 3D K-space 960 to be denser than a second non-uniform sampling pattern that corresponds to a block located in a peripheral region of the 3D K-space 960. Referring to FIG. 9B, a non-uniform sampling pattern of a block 980 located in a central region of the 3D K-space may include acquired signals more densely than non-uniform sampling patterns of other blocks in the 3D K-space 960.

The setting of the non-uniform sampling pattern will be described below with reference to FIGS. 9C, 9D, 9E, and 9F.

FIGS. 9C, 9D, 9E, and 9F are diagrams of exemplary embodiments of setting a non-uniform sampling pattern.

Figure 9C:
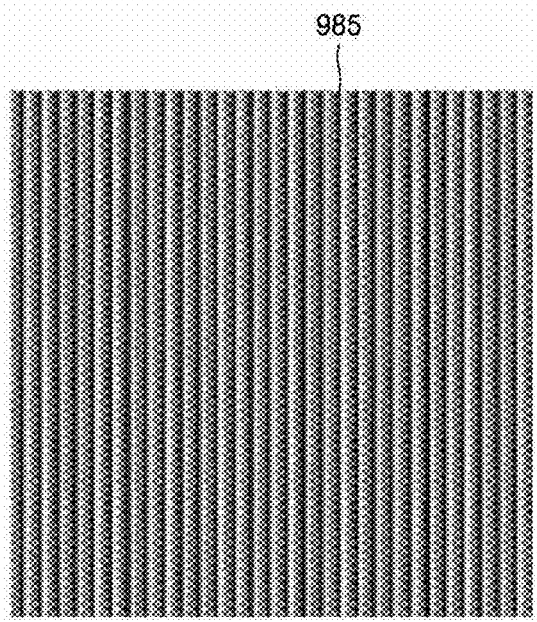
FIGS. 9C, 9D, 9E, and 9F are diagrams of exemplary embodiments of setting a non-uniform sampling pattern.

FIG. 9C shows an example of incomplete 3D K-space data 985 on a Ky-Kz plane. The controller 425 may acquire the incomplete 3D K-space data 985 which has one non-uniform sampling pattern such that a non-uniform sampling pattern is repeated in the entirety of the 3D K-space.

Figure 9D:
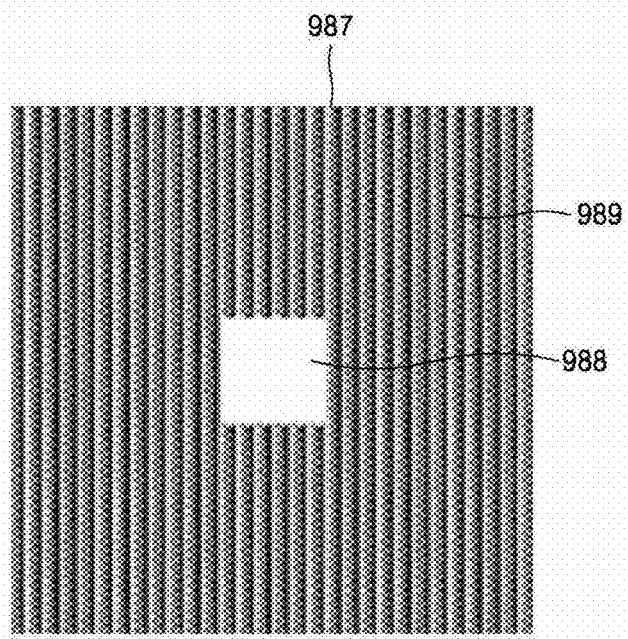

FIG. 9D is another example of incomplete 3D K-space data 987 on the Ky-Kz plane. The controller 425 may set a different non-uniform sampling pattern in a central area 988 as compared to other areas 989 in the 3D K-space. For example, the controller 425 may set a first non-uniform sampling pattern of the central area 988 which differs from a second non-uniform sampling pattern of the other areas 989 so that signals are more densely acquired in the central area 988 than in the other areas 989.

Alternatively, the controller 425 may acquire signals by full-sampling in the central area 988 but acquire signals by applying the non-uniform sampling pattern in the other areas 989, so that that signals are more densely acquired in the central area 988 than in the other areas 989.

Figure 9E:
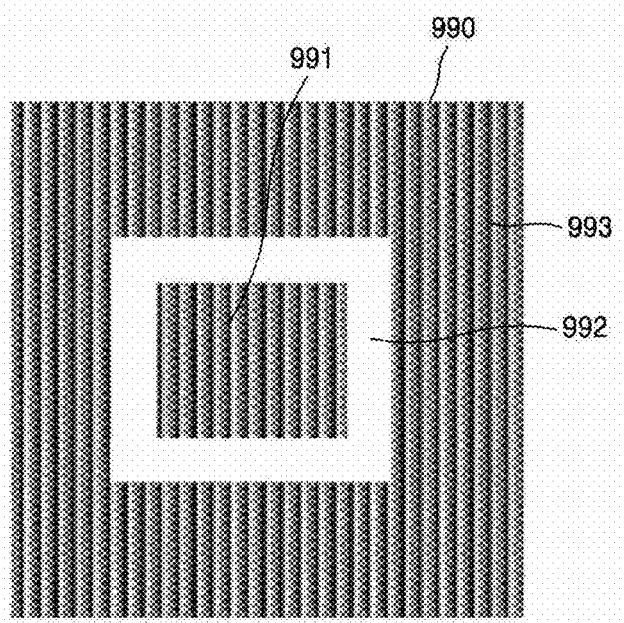

FIG. 9E is another example of incomplete 3D K-space data 990 on the Ky-Kz plane. The controller 425 may divide the 3D K-space into a plurality of areas, and individually apply a respective non-uniform sampling pattern to each of the divided areas. For example, as shown in FIG. 9E, the controller 425 may apply different non-uniform sampling patterns on a first area 991 that is the central area of the 3D K-space, a second area 992 nearby the first area 991, and a peripheral area 993 other than the first and second areas 991 and 992.

For example, the controller 425 may apply a different respective non-uniform sampling pattern to the first area 991, the second area 992, and the peripheral area 993 so that signals are more densely acquired in the central area of the 3D K-space.

Alternatively, the controller 425 may apply a first non-uniform sampling pattern to the first area 991 and a second non-uniform sampling pattern to the peripheral area 993 so that signals are more densely acquired in the first area 991 than in the peripheral area 993. Further, the second area 992 may be full-sampled to acquire signals.

Alternatively, the controller 425 may apply an identical non-uniform sampling pattern to each of the first area 991 and the peripheral area 993 and acquire signals in the first area 991 and the peripheral area 993, and full-sample the second area 992 to acquire signals.

Figure 9F:
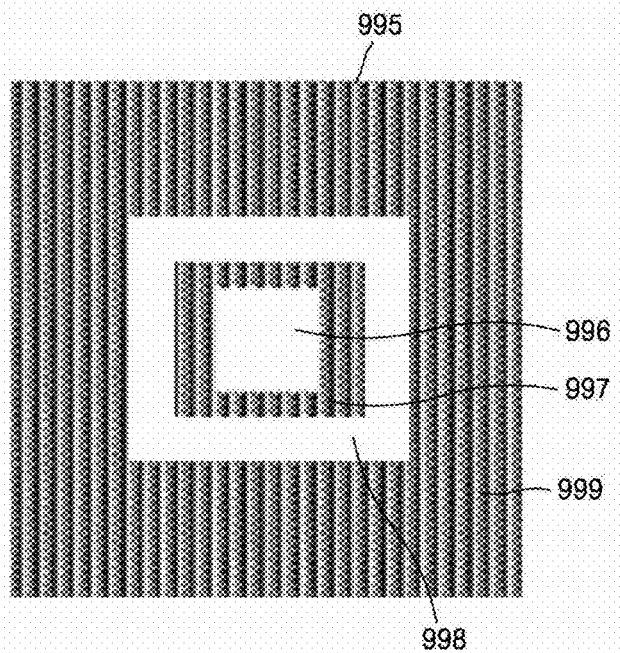

FIG. 9F is another example of incomplete 3D K-space data 995 on the Ky-Kz plane. The controller 425 may divide the 3D K-space into first, second, third, and fourth areas 996, 997, 998, and 999 such that the 3D K-space is distinguished as a central area and peripheral areas, and then apply different non-uniform sampling patterns on each of the first, second, third, and fourth areas 996, 997, 998, and 999.

For example, the controller 425 may apply different non-uniform sampling patterns to each of the first, second, third, and fourth areas 996, 997, 998, and 999 such that the density of acquired signals increases based on the proximity of the respective area to the center of the 3D K-space.

Alternatively, the controller 425 may acquire signals by full-sampling the first and third areas 996 and 998, and apply different non-uniform sampling patterns to the second and fourth areas 997 and 999. In particular, the controller 425 may set a first non-uniform sampling pattern to the second area 997 and a second non-uniform sampling pattern to the fourth area 999 so that signals are more densely acquired in the second area 997 than in the fourth area 999.

Alternatively, the controller 425 may divide the 3D K-space 960 into a plurality of blocks, and individually perform an unacquired signal restoration operation on each of the blocks. Alternatively, the controller 425 may simultaneously perform unacquired signal restoration operations on each of the blocks. In particular, the controller 425 may simultaneously perform acquisition of the spatial correlation coefficient Kc and the unacquired signal restoration operations on each of the nine blocks shown in FIG. 9B.

Alternatively, the controller 425 may sequentially perform the acquisition of the spatial correlation coefficient Kc and the unacquired signal restoration operations on the plurality of blocks. In particular, the controller 425 may perform the acquisition of the spatial correlation coefficient Kc and the unacquired signal restoration operation on a first block 981, and then sequentially, perform the acquisition of the spatial correlation coefficient Kc and the unacquired signal restoration operation on a second block 982. Next, the controller 425 may perform the acquisition of the spatial correlation coefficient Kc and the unacquired signal restoration operation on a third block 983, and then, perform the acquisition of the spatial correlation coefficient Kc and the unacquired signal restoration operation on a fourth block 984.

FIGS. 10A, 10B, and 10C are diagrams for describing a weighting matrix W. As described above, the weighting matrix W may refer to the spatial correlation coefficient Kc.

FIG. 10A shows an example in which the RF multi-coil 405 or 605 includes n coils, i.e., a first channel coil (coil #1) 1011, a second channel coil (coil #2) 1012 to an N-th channel coil (coil #N) 1013.

The image processor 420 may acquire the spatial correlation coefficient Kc from each of the plurality of coils 1011, 1012, and 1013 in the RF multi-coil 405 or 605.

In particular, a spatial correlation coefficient Kc that corresponds to a first channel may be calculated by using an MR signal received from the first channel coil 1011. Further, a spatial correlation coefficient Kc that corresponds to a second channel may be calculated by using an MR signal received from the second channel coil 1012. In addition, a spatial correlation coefficient Kc that corresponds to an N-th channel may be calculated by using an MR signal received from the N-th channel coil 1013.

When the spatial correlation coefficient Kc is referred to as the weighting matrix W as described above, the weighting matrix W may be calculated by using a block group (g), a coil number (j), an acceleration factor (r), a number of coils ($N_c$), etc.

FIG. 10B shows a formula for calculating the spatial correlation coefficient Kc described with reference to FIG. 9A. In particular, the formula of FIG. 10B is an example of a formula for calculating the spatial correlation coefficient Kc.

Referring the formula of FIG. 10B, a left side 1050, a right side 1070, and a weighting matrix 1060 may respectively correspond to the right side 920, the left side 910 of the matrix calculation, and the spatial correlation coefficient Kc as illustrated in drawing (a) of FIG. 9A.

FIG. 10C shows factors used in the formula shown in FIG. 10B.

Referring to FIGS. 10B and 10C, g indicates a block group. When incomplete 3D K-space data acquired from a 3D-K-space (e.g., the 3D K-space 960 of FIG. 9B) that corresponds to one channel coil is divided into a plurality of blocks, a block (e.g., the first block 981) may be a block group.

For example, suppose that incomplete 3D K-space data acquired by sampling an MR signal received from a channel coil has a size of 256*256*256. In this case, the incomplete 3D K-space data has 256 lines toward a Kx-axis, 256 lines toward a Ky-axis, and 256 lines toward a Kz-axis. As shown in FIG. 7C, the incomplete 3D K-space data may be full-sampled in the Kx-axis direction and a line parallel to the Kz-axis direction may be sampled such that intervals between pairs of mutually adjacent signals are non-uniform. As shown in FIG. 9B, when the incomplete 3D K-space data is divided into three blocks in the Ky-axis direction and three blocks in the Kz-axis direction, in a single block, 256/3=about 85 lines may be included in the Ky-axis direction, and about 256/3=about 85 lines may be included in the Kz-axis direction.

In the aforementioned example, since the number of block groups is equal to nine, 'g' may have a value from 1 to 9. Since T indicates the coil number, when the RF multi-coil 405 includes a plurality of coils, T indicates the number of coils in the RF multi-coil 405. In particular, according to the example shown in FIG. 10A, the coil number T may have a value between 1 and N (wherein N is a natural number).

'B' indicates a block size. In particular, '$B_y$' indicates a block size in the Ky-axis direction, and '$B_z$' indicates a block size in the Kz-axis direction. According to the aforementioned example, $B_y$ may be equal to 85, which is the number of lines in one block, and $B_z$ may also be equal to the number of lines in one block.

'n' indicates a block number in a group, that is, a block number of a predetermined block in incomplete 3D K-space data that corresponds to a coil. In particular, a block number of the first block 981 that is arranged first in the 3D K-space 960 may be 1, and a block number of the second block 982 arranged second in the 3D K-space 960 may be 2.

'$N_c$' indicates the number of coils in the RF multi-coil 405. '$N_b$' indicates the number of blocks adjacent to a current block. In particular, the number of blocks arranged nearby the current block (e.g., the block 920) in K-space data may be 8, which is the number of blocks other than the current block 920 in the 3D K-space 960.

'$N_r$' and '$N_l$' may respectively indicate the number of pieces of data located at left and right of a selected point in frequency encoding data arranged in the Kx-axis direction of the 3D K-space. 'r' indicates an acceleration factor. $M(b_y,r)$ or $M(b_z,r)$ indicates a non-uniform sampling pattern that is a non-uniform sampling mask with an acceleration factor r in a block b.

In particular, '$S_{g,j}$' of FIG. 10B indicates a signal value at a point selected from a predetermined block in the incomplete 3D K-space data, and '$S_{g,c}$' indicates signal values acquired at other points in the predetermined block. Further, '$W_{g,j,r}$' indicates a weighting matrix applied in a block, and refers to the aforementioned spatial correlation coefficient Kc. In particular, referring to FIG. 10B, '$S_{g,j}(K_y+B_y(n_y-1), K_x, K_z+B_z(n_z-1))$' 1050 indicates signal values of a line that is parallel to the Kx-axis direction at a '$k_y+B_y(n_y-1)$' point in the Ky-axis direction and at a '$K_z+B_z(n_z-1)$' point in the Kz-axis direction, and a signal value of the aforementioned reference signal. Further, '$S_{g,c}(K_y+M(b_y,r), K_x+h^*\Delta K_x, K_z+M(b_z,r))$' 1070 indicates signal values of acquired signals that form a spatial relationship with signals values in reference line data.

For example, the spatial correlation coefficient Kc, i.e., a weighting matrix 1060 may be calculated by using the formula of FIG. 10B, and unacquired signals may also be calculated by using the formula of FIG. 10B.

Figure 11:
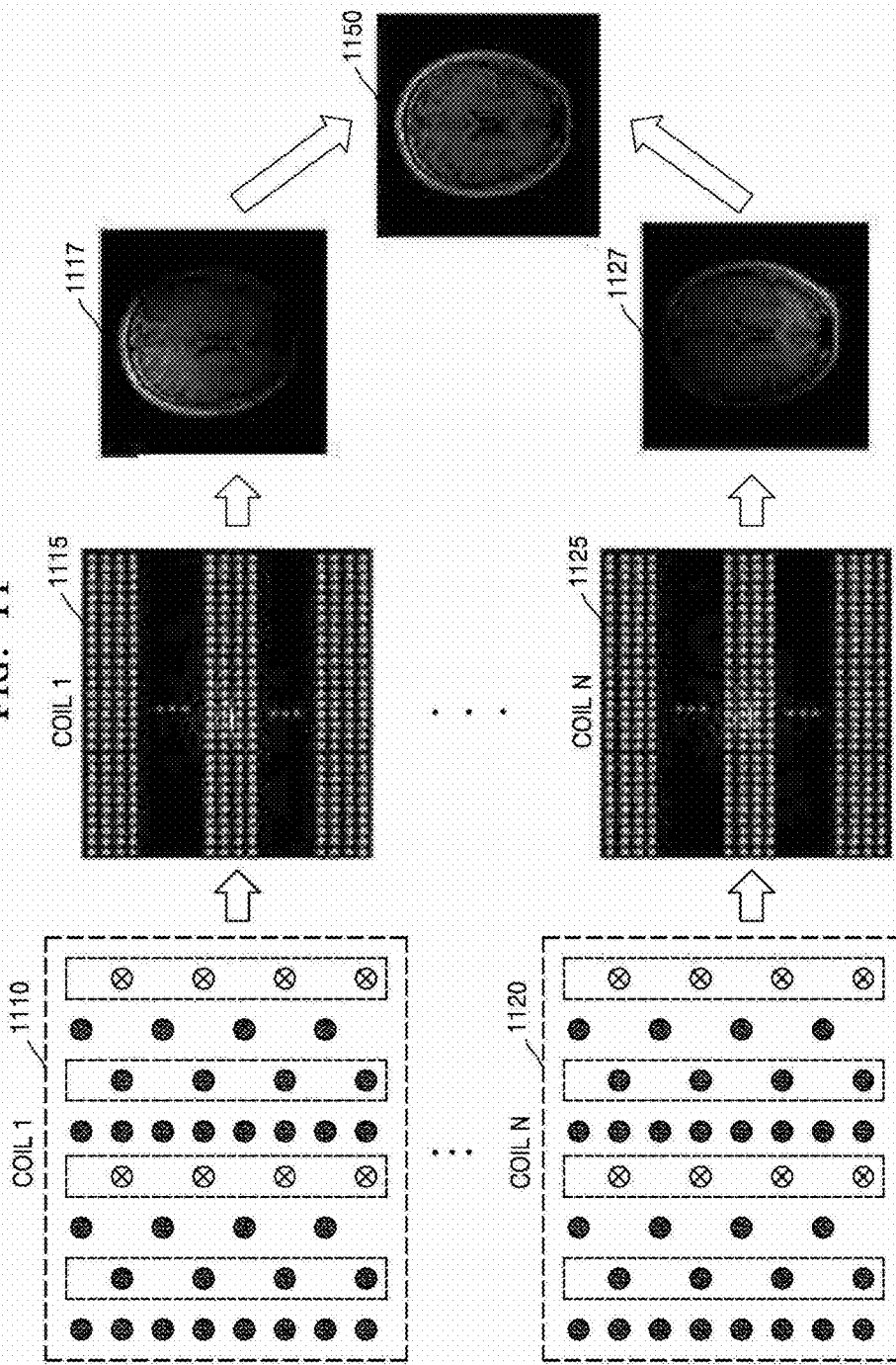
FIG. 11 is a diagram for describing MR image restoration, according to an exemplary embodiment of an MR image.

FIG. 11 is a diagram for describing MR image restoration, according to an exemplary embodiment of an MR image.

The image processor 420 may restore a complete set of 3D K-space data according to each of a plurality of channel coils in the RF multi-coil 405, and thus restore a plurality of pieces of the complete set of 3D K-space data that corresponds to the plurality of channel coils.

Referring to FIG. 11, when the RF multi-coil 405 includes n channel coils (i.e., COIL 1 to COIL N), the image processor 420 may perform respective unacquired signal restoration operations on n incomplete 3D K-space data sets 1110 and 1120 that respectively correspond to the n channel coils. Accordingly, n complete sets of 3D K-space data 1115 and 1125 that respectively correspond to the n channel coils (COIL 1 to COIL N) may be acquired. FIG. 11 shows an example in which a non-uniform sampling pattern to be applied to incomplete 3D K-space data (e.g., the incomplete 3D K-space data 1110) is the same as the non-uniform sampling pattern of FIG. 7B.

Further, the image processor 420 may generate a plurality of MR images 1117 and 1127 according to channels by spatially transforming the complete 3D K-space data 1115 and 1125 that respectively correspond to the plurality of channel coils, and then, acquire a final MR image 1150 by using the MR images 1117 and 1127.

In particular, the image processor 420 may generate the MR images 1117 and 1127 according to channels by spatially transforming the complete 3D K-space data 1115 and 1125, and then, a sum of the MR images 1117 and 1127 may be acquired so as to restore a 3D MR image 1150.

In particular, in order to change the complete 3D K-space data 1115 and 1125 from a frequency domain to a spatial domain, inverse Fourier transformation or inverse fast Fourier transformation may be performed. Then, a sum of squares or a complex sum of the inverse fast Fourier transformed MR images 1117 and 1127 may be acquired in order to obtain the final MR image 1150.

Figure 12A:
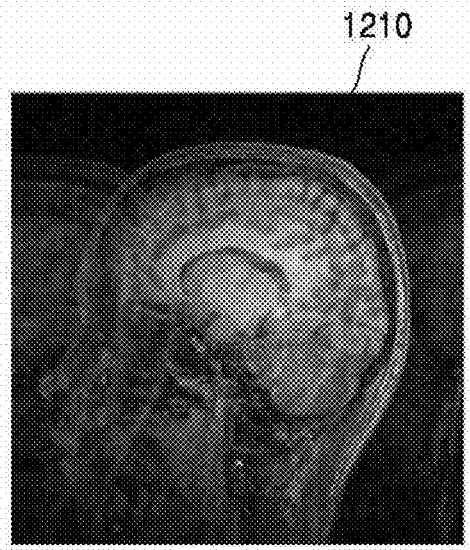
FIGS. 12A and 12B are MR images restored according to exemplary embodiments.
Figure 12B:
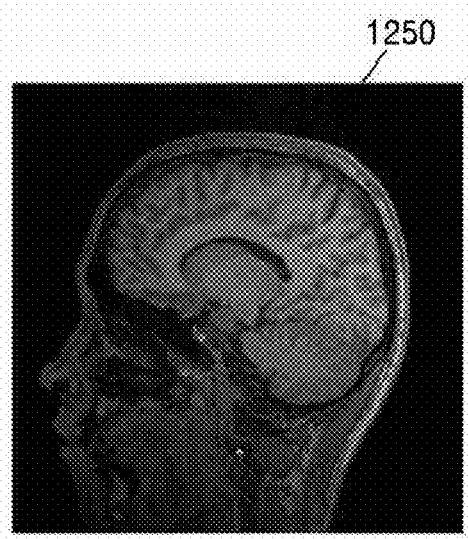

FIGS. 12A and 12B are MR images restored according to exemplary embodiments.

Referring to FIG. 12A, a final MR image 1210 is restored based on incomplete 3D K-space data that is sampled by using a non-uniform sampling pattern. The final MR image 1210 shows scattered aliasing artifacts.

Referring to FIG. 12B, an image 1250 is acquired by image processing the final MR image 1210 to improve image quality.

When restored K-space data is generated by restoring undersampled K-space data and a final MR image is generated by using the restored K-space data, in order to sequentially improve the quality of the final MR image, image quality improvement processing functions such as noise reduction, edge enhancement, contrast enhancement, and/or any other suitable image processing functions may be performed.

When aliasing artifacts are scattered in an MR image, image quality improvement processing may be sequentially performed to remove the aliasing artifacts in the MR image and thus reduce the aliasing artifacts. Therefore, according to the present exemplary embodiment, the image 1250 with minimized noise or defects may be finally acquired.

FIG. 13 is a flowchart of an MRI method 1300, according to an exemplary embodiment. The MRI method 1300 according to an exemplary embodiment may include the same features and inventive concept as the exemplary embodiments described above with reference to FIGS. 1 to 12. Therefore, features that have been described above with reference to FIGS. 1 to 12 will not be repeatedly described.

Referring to FIG. 13, the MRI method 1300 may include, in operation 1310, sampling respective MR signals which are received from each of a plurality of channel coils in an RF multi-coil such that intervals between pairs of acquired signals that are mutually adjacent in a first axis direction of a 3D K-space are non-uniform, and acquiring a plurality of pieces of incomplete 3D K-space data that respectively correspond to the plurality of channel coils. Since operation 1310 is the same as the operations of the data acquirer 410 as described above, a further detailed description of operation 1310 will be omitted.

Next, in operation 1320, a complete set of 3D K-space data is restored based on relationships between the acquired signals in the incomplete 3D K-space data. Since operation 1320 is the same as the operations of the image processor 420 as described above, a further detailed description of operation 1320 will be omitted.

An MRI apparatus and an MRI method according to one or more exemplary embodiments may improve a quality of a restored MR image. In particular, by acquiring 3D K-space data that is undersampled according to non-uniform sampling intervals, it is possible to prevent quality reduction due to aliasing artifacts and improve the quality of the restored MR image.

Further, an MRI apparatus and an MRI method according to one or more exemplary embodiments may facilitate rapid acquisition of an MR image by undersampling according to non-uniform intervals. Still further, even without using an additional calibration signal as in Generalized Autocalibrating Partially Parallel Acquisitions (GRAPPA) or coil sensitivity maps with additional coil information as in Simultaneous Acquisition of Spatial Harmonics (SMASH), a spatial correlation coefficient may be acquired and an MR image with improved image quality may be quickly acquired.

In addition, since a K-space is sampled according to blocks by using an MRI apparatus and an MRI method according to one or more exemplary embodiments, effective image restoration may be performed in all areas of a K-space image, including a low frequency area and a radio frequency area.

The exemplary embodiments may be written as computer programs and may be implemented in general-use digital computers that execute the programs using a transitory or non-transitory computer-readable recording medium.

Examples of the non-transitory computer-readable recording medium include magnetic storage media (e.g., ROM, floppy disks, hard disks, etc.), optical recording media (e.g., CD-ROMs or DVDs), and/or any other suitable medium.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. Accordingly, the above exemplary embodiments and all aspects thereof are examples only and are not limiting.

What is claimed is:

1. A magnetic resonance imaging (MRI) apparatus comprising:
   a data acquirer configured to acquire a plurality of pieces of 3-dimensional (3D) K-space data which respectively correspond to a plurality of channel coils by sampling respective magnetic resonance (MR) signals received from each of the plurality of channel coils in a radio frequency (RF) multi-coil on a plurality of planes that are perpendicular to a first axis direction of a 3D K-space such that intervals between pairs of the received signals that are mutually adjacent in the first axis direction of a 3D K-space are non-uniform, wherein each of the plurality of planes is formed by a Kx-axis corresponding to frequency encoding and a Ky-axis corresponding to phase encoding; and
   an image processor configured to use the acquired plurality of pieces of data to restore a complete set of 3D K-space data based on respective spatial relationships between the received signals.

2. The MRI apparatus of claim 1, wherein the data acquirer is further configured to acquire the plurality of pieces of 3D K-space data by sampling the received MR signals on the plurality of planes that are perpendicular to the first axis direction and are adjacent to one another, and that include at least one first plane that is full-sampled, at least one second plane that is undersampled, and at least one third plane that is not sampled.

3. The MRI apparatus of claim 1, wherein a non-uniform sampling pattern is formed by sampling the MR signals based on lines such that the intervals between the pairs of received signals that are mutually adjacent in the first axis direction of the 3D K-space are non-uniform, and the non-uniform sampling pattern is repeated a plurality of times in the 3D K-space in correspondence with the plurality of channel coils.

4. The MRI apparatus of claim 1, wherein the data acquirer is further configured to acquire the plurality of pieces of 3D K-space data by acquiring line data that has a direction that is parallel to a second axis direction which is perpendicular to the first axis direction and is completely sampled such that the intervals between the pairs of received signals that are mutually adjacent in the first axis direction of the 3D K-space are non-uniform, and wherein at least one line formed in a direction that is parallel to the first axis in the plurality of pieces of 3D K-space data forms a non-uniform sampling pattern in which intervals between pairs of mutually adjacent received signals are non-uniform.

5. The MRI apparatus of claim 1, wherein a plurality of pieces of acquired line data that has a direction that is parallel to a second axis direction which is perpendicular to the first axis direction of the plurality of pieces of 3D K-space data forms a non-uniform sampling pattern in which intervals between pairs of adjacent acquired line data from among the plurality of pieces of acquired line data are non-uniform.

6. The MRI apparatus of claim 1, wherein the image processor is further configured to determine, from the plurality of pieces of 3D K-space data, a first spatial correlation coefficient which is based on a spatial relationship between a reference signal and a plurality of other received signals, and to restore at least one unacquired signal that relates to the plurality of pieces of 3D K-space data based on the spatial relationship and the determined first spatial correlation coefficient.

7. The MRI apparatus of claim 6, wherein when a first signal, which is an unacquired signal that relates to the plurality of pieces of 3D K-space data, and the plurality of other acquired signals satisfy the spatial relationship, the image processor is further configured to acquire the first signal based on the determined first spatial correlation coefficient.

8. The MRI apparatus of claim 1, wherein the image processor is further configured to divide the plurality of pieces of 3D K-space data into a plurality of blocks, and to restore the complete set of 3D K-space data based on the plurality of blocks by using relationships between received signals included in the divided plurality of pieces of 3D K-space data.

9. The MRI apparatus of claim 8, wherein a non-uniform sampling pattern, which is formed by a plurality of pieces of line data that has a direction that is parallel to a second axis direction which is perpendicular to the first axis direction of the plurality of pieces of 3D K-space data, is identical in each of the plurality of blocks.

10. The MRI apparatus of claim 9, wherein the data acquirer is further configured to acquire at least one additional signal from any one of the plurality of blocks.

11. The MRI apparatus of claim 9, wherein the data acquirer is further configured to acquire at least one less signal from any one of the plurality of blocks.

12. The MRI apparatus of claim 8, wherein a non-uniform sampling pattern formed by a line that is parallel to the first axis direction of the plurality of pieces 3D K-space data varies with respect to at least two of the plurality of blocks.

13. The MRI apparatus of claim 12, further comprising a controller configured to set a first non-uniform sampling pattern that corresponds to a block located in a central area of the 3D K-space to be denser than a second non-uniform sampling pattern that corresponds to a block located in a peripheral area of the 3D K-space.

14. The MRI apparatus of claim 1, wherein the image processor is further configured to restore the complete set of 3D K-space data according to each of the plurality of channel coils and thus restore a plurality of pieces of complete 3D K-space data that corresponds to the plurality of channel coils.

15. The MRI apparatus of claim 14, wherein the image processor is further configured to restore a 3D MR image by spatially transforming the plurality of pieces of complete 3D K-space data and using a sum of the plurality of pieces of spatially transformed complete 3D K-space data.

16. A magnetic resonance imaging (MRI) method comprising:

acquiring a plurality of pieces of 3-dimensional (3D) K-space data which respectively correspond to a plurality of channel coils by sampling respective magnetic resonance (MR) signals received from each of the plurality of channel coils in a radio frequency (RF) multi-coil on a plurality of planes that are perpendicular to a first axis direction of a 3D K-space such that intervals between pairs of the received signals that are mutually adjacent in the first axis direction of a 3D K-space are non-uniform, wherein each of the plurality of planes is formed by a Kx-axis corresponding to frequency encoding and a Ky-axis corresponding to phase encoding; and using the acquired plurality of pieces of data to restore a complete set of 3D K-space data based on respective spatial relationships between the received signals.

* * * * *